(12) United States Patent
Osawa et al.

(10) Patent No.: US 7,205,078 B2
(45) Date of Patent: Apr. 17, 2007

(54) METHOD FOR GENERATING BACKSCATTERING INTENSITY ON THE BASIS OF LOWER LAYER STRUCTURE IN CHARGED PARTICLE BEAM EXPOSURE, AND METHOD FOR FABRICATING SEMICONDUCTOR DEVICE UTILIZING THIS METHOD

(75) Inventors: Morimi Osawa, Kawasaki (JP); Kozo Ogino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 458 days.

(21) Appl. No.: 10/853,760

(22) Filed: May 26, 2004

(65) Prior Publication Data

US 2005/0040344 A1 Feb. 24, 2005

(30) Foreign Application Priority Data

Aug. 21, 2003 (JP) ............................. 2003-297371
Mar. 4, 2004 (JP) ............................. 2004-060083

(51) Int. Cl.
*G03F 9/00* (2006.01)
*H01J 37/302* (2006.01)

(52) U.S. Cl. ....................... 430/30; 430/296; 430/942; 250/492.2; 250/492.22; 250/492.3; 716/21

(58) Field of Classification Search ................. 430/30, 430/296, 942; 250/492.2, 492.22, 492.3; 716/21

See application file for complete search history.

(56) References Cited

U.S. PATENT DOCUMENTS

| | | | | |
|---|---|---|---|---|
| 6,243,487 B1 * | 6/2001 | Nakajima | ................... | 382/144 |
| 6,544,700 B2 * | 4/2003 | Ogino | ......................... | 430/30 |
| 6,831,283 B2 * | 12/2004 | Yoda et al. | ............ | 250/492.22 |
| 6,835,942 B2 * | 12/2004 | Magoshi et al. | ....... | 250/492.22 |
| 6,845,497 B2 * | 1/2005 | Murai et al. | .................. | 716/20 |

FOREIGN PATENT DOCUMENTS

| | | |
|---|---|---|
| JP | 7-078737 | 3/1995 |
| JP | 10-275762 | 10/1998 |
| JP | 2001-052999 | 2/2001 |
| JP | 2002-313693 | 10/2002 |

OTHER PUBLICATIONS

Magoshi, Shunko, et al., "Proximity effect correction on the multi-level interconnect metal for the high-energy electron-beam lithography", *Emerging Lithographic Technologies VII*, Roxann L. Engelstd. Editor, Proceedings of SPIE, vol. 5037 (2003).

Murai, Fumio, et al., "Fast proximity effect correction method using a pattern area density map", *J. Vac. Sci. Technol. B*, vol. 10, No. 6, pp. 3072-3076.

"Data Processing System for Block Exposure: BEXELWIN", FUJITSU.50.6, pp. 405-410.

Ogino, Kozo, et al., "3D Proximity Effect Correction for Multi-Layer Structures in EB Lithography", Digest of Papers 2003, *International Microprocessors and Nanotechnology Conference*.

* cited by examiner

*Primary Examiner*—Christopher G. Young
(74) *Attorney, Agent, or Firm*—Staas & Halsey LLP

(57) ABSTRACT

A method for generating backscattering intensity with which charged particles are backscattered to a resist layer when charged particle beam is irradiated onto the resist layer which is formed on plural layers, each of which includes a pattern of one substance or a plurality of substances. For the $n^{th}$ layer from the resist layer among the plural layers, there is provided, for each of the substances in the $n^{th}$ layer, a reflection coefficient rn, which corresponds with the number of particles reflected by the $n^{th}$ layer; a transmission coefficient tn, which corresponds with the number of particles transmitted by the $n^{th}$ layer; and a scatter distribution in which the charged particles are scattered within the $n^{th}$ layer. The generation method comprises a first step of generating the backscattering intensity by using the reflection coefficient rn, the transmission coefficient tn, and the scatter distribution.

29 Claims, 21 Drawing Sheets

Method of generating backscattering electron intensity

Types of Backscattered Electrons

Types of Backscattered Electrons

E1: Emerge from W after being reflected by W
E2: Emerge from W after passing through W
E3: Emerge from $SiO_2$ after passing through W
E4: Enter the $SiO_2$ and emerge from the W
E5: Enter the $SiO_2$ and emerge from the $SiO_2$
E6: Emerge from $SiO_2$ after being reflected by same

FIG. 7

Parameters for Each Layer

| | Reflectance | Transmittance | Distribution Length (Distance coefficient) |
|---|---|---|---|
| Resist | 0 | 1 | ~0 |
| Al | $r_{Al}$ | $t_{Al}$ | $\sigma_{Al}(a_{Al})$ |
| W | $r_W$ | $t_W$ | $\sigma_W(a_W)$ |
| SiO$_2$ | $r_{SiO2-1}$ | $t_{SiO2-1}$ | $\sigma_{SiO2}(a_{SiO2-1})$ |
| Al | $r_{Al}$ | $t_{Al}$ | $\sigma_{Al}(a_{Al})$ |
| SiO$_2$ | $r_{SiO2-2}$ | $t_{SiO2-2}$ | $\sigma_{SiO2}(a_{SiO2-2})$ |
| W | $r_W$ | $t_W$ | $\sigma_W(a_W)$ |
| SiO2 | $r_{SiO2-1}$ | $t_{SiO2-1}$ | $\sigma_{SiO2}(a_{SiO2-1})$ |
| Bulk Si | $r_{Si}$ | 0 | $\sigma_{SiO2}(a_{SiO2-1})$ |

FIG. 9  Area density method for electron distribution in which electrons, reaching W/SiO$_2$ layer 16, given the influence to Al layer 15

Generalized method for determining backscattering intensity

Experiment Result showing Effect of Present Invention

Procedure for Generating Exposure Data of First Embodiment

IN1, IN2, INn    Design Data for 1, 2, nth layers.
OUT1, OUT2, OUTn    Exposure Data for 1, 2, nth layers.

Principle of Second Embodiment

Flowchart for Procedure for Generating Exposure Data
According to the Second Embodiment IN1, IN2, INn          Design Data for 1, 2, nth layers.
OUT1, OUT2, OUTn    Exposure Data for 1, 2, nth layers.
M0, M1, M2, Mn       Charged Particle Intensity Coefficient
                            Map for 0, 1st, 2nd, nth layers.

Mn=E1+E4

Charged Particle Intensity Coefficient Map

Charged Particle Intensity Coefficient Map

METHOD FOR GENERATING BACKSCATTERING INTENSITY ON THE BASIS OF LOWER LAYER STRUCTURE IN CHARGED PARTICLE BEAM EXPOSURE, AND METHOD FOR FABRICATING SEMICONDUCTOR DEVICE UTILIZING THIS METHOD

CROSS-REFERENCE TO RELATED APPLICATIONS

This application is based upon and claims the benefit of priority from the prior Japanese Patent Application No. 2003-297371, filed on Aug. 21, 2003, and No. 2004-60083, filed on Mar. 4, 2004 the entire contents of which are incorporated herein by reference.

BACKGROUND OF THE INVENTION

1. Field of the Invention

The present invention relates to a method for generating backscattering intensity on the basis of a lower layer structure in a charged particle beam exposure, and to a method for fabricating a semiconductor device that utilizes this method. More particularly, the present invention provides a more accurate method of determining the backscattering intensity by considering the influence of charged particles on the surrounding area in the case of a lower layer structure with a plurality of layers, and provides a method for fabricating a semiconductor device that enables more precise proximity effect correction.

2. Description of the Related Art

In recent years, the increased integration of semiconductor devices has been accompanied by increased intricacy in the pattern size required, hence the resolving power of conventional exposure methods using light is inadequate, and the formation of fine patterns is becoming problematic. Therefore, exposure methods that employ a charged particle beam and, more particularly, an electron beam are now being used. Electron beam exposure methods include point beam exposure which has a high resolution but a low throughput; variable shaped beam exposure, which raises the throughput by exposing the pattern in small rectangular units; partial batch exposure methods (block exposure methods), which subject an emerging patterns that is repeated in a chip to a batch transfer by using a stencil mask; and projection-type exposure methods, which create a mask for the whole pattern in the same manner as in optical exposure and then perform a large area batch transfer, and so forth. With the partial batch exposure methods and projection-type exposure methods, the electron beam shot number can be reduced, and hence the throughput can be raised. However, a drop in the exposure accuracy is readily brought about because it is not possible to change the exposure amount in accordance with the exposure pattern.

One problem that is common to such charged particle beam exposure methods (simply 'electron beam exposure methods' hereinbelow) is that the dimensions of the resist fluctuate due to the proximity effect. The electrons that pass through the resist are scattered by the substance constituting the substrate and return inside the resist, meaning that the resist is re-exposed. The amount of electrons returning to the resist is proportionate to the sparseness or denseness of the pattern, and hence the margin of fluctuation of the resist dimensions caused by the proximity effect also varies in accordance with the pattern layout.

As a method for correcting the proximity effect, a method has been proposed that estimates the influence of the electrons returning from the substrate in each area on the basis of an energy distribution function (EID: Exposure Intensity Distribution) in which electrons entering from one point are supplied to the resist, optimizes the exposure amount of this area accordingly, or changes the pattern dimensions, and so forth. This method appears in Japanese Laid Open Patent Publication No. 2001-52999 (published on Feb. 23, 2001) and the corresponding American patent (U.S. Pat. No. 6,610,989 issued on Aug. 26, 2003), as well as in Japanese Laid Open Patent Publication No. 2002-313693 (published on Oct. 25, 2002) and the corresponding American Laid Open Patent No. 2002-0177056 (published on Nov. 28, 2002), which will be described later, for example.

The EID function is generally known and expressed by the sum of two Gaussian distributions, i.e. by the following equation, when the substrate is constituted by one type of substance.

$$f(x, y) = \frac{1}{\pi(1+\eta)} \left\{ \frac{1}{\beta_f^2} \exp\left(-\frac{x^2+y^2}{\beta_f^2}\right) + \frac{\eta}{\beta_b^2} \exp\left(-\frac{x^2+y^2}{\beta_b^2}\right) \right\} \quad (1)$$

Here, $\beta f$ is the forward scatter length, $\beta b$ is the backward scatter length, and $\eta$ is the forward and backward scatter ratio. The first term represents the energy supplied to the resist by the incident electrons, and the second term represents the energy supplied to the resist by the electrons reflected by the substrate, these terms being respectively known as the forward scatter term and backward scatter term.

When electron beam exposure is performed in a semiconductor integrated circuit (LSI) fabrication process, a structure consisting of wiring and contact plugs and so forth is already created in layers below the resist, and the substrate is constituted by a plurality of substances. Because, if the substances constituting the lower layers are different, the parameters of the backscatter term are different, it is not possible to estimate the influence on the exposure intensity distribution by means of a simple Gaussian distribution function such as that shown in Equation (1) above. In order to resolve this problem, a procedure that carries out proximity effect correction by considering the structure one layer below the resist has been proposed (J. Vac. Sci. Technol. B, Vol. 10, No. 6, pages 3072 to 3076 (1992) described later, for example). According to this procedure, in a case where the structure one layer below the resist is constituted by tungsten (W) contact plugs and a silicon oxide film ($SiO_2$) that is embedded between the W plugs, for example, when the backscattering intensity is determined by means of the area density method, the influence of the backscattered electrons that return from an area in which the exposure pattern density is $\alpha$ and the W density of the lower layer is $\alpha w$ is determined by the following equation.

$$\alpha(\alpha_w \eta_w + (1-\alpha_w)\eta_{SiO2}) \quad (2)$$

where $\eta w$ and $\eta_{SiO2}$ are forward and backward scatter ratios determined in a W or $SiO_2$ state.

However, the substances that constitute the wiring, contact holes and so forth are normally equal to or less than 1 um (where 'μ' has been expediently written as 'u') and thin, and therefore the electrons reach even lower layers. When electrons that have passed through a single layer return to the resist, because the electrons are affected by the wiring and contact holes in the process, the backscattering intensity cannot be determined simply by means of Equation (2) above. For example, when a layer that is one layer below the exposed Al layer to be patterned is constituted by W contact holes and $SiO_2$, which is embedded between these contact holes, the W readily scatters the electrons and hence few electrons escape to lower layers. On the other hand, electrons entering the $SiO_2$ enter relatively deeply. However, electrons entering the $SiO_2$ deeply are scattered by the W contact holes in the process of returning to the resist. Therefore, the quantity of electrons that return after being backscattered is reduced in comparison with a case where the whole of the lower layer consists of $SiO_2$. In addition, because the LSI wiring structure also consists of, not two layers, but any number of stacked layers, the electrons that escape the layer one layer below are also affected by layers two or three layers below.

Therefore, a determination of the backscattering intensity by considering the plural layer structure of the layers below the resist layer has been proposed ('Emerging Lithographic Technologies VII, Roxann L, Engelstd, Editor, Proceedings of SPIE Vol. 5037 (2003)' (described later, for example). In the case of the procedure mentioned in this prior publication, areas are classified in accordance with the lower layer structure in order to consider the plural layer structure of the lower layers. For example, such areas include areas where W is not present in a lower layer, areas where W is present only one layer below the resist, areas where W is present only two layers below, and areas where W is present both one and two layers below, and so forth. Thereafter, backscattering calculations using the area density method are performed by using forward and backward scatter ratios and backward scatter lengths that differ for each area.

Further, the addition of marginal exposure so that the backscattering intensity is made uniform by considering the plural wiring layer structure that exists in the layers below the resist layer has also been proposed (Japanese Laid Open Patent Publication No. 2950280 (published on Sep. 20, 1999) and the corresponding American U.S. Pat. No. 6,243, 487 B1 (published on Jun. 5, 2001), for example). In this prior publicatio, the backscattering intensity is made uniform irrespective of the lower-layer wiring layer structure by generating marginal exposure in accordance with the respective pattern densities of the plurality of wiring layers of the lower layers.

SUMMARY OF THE INVENTION

However, although the prior art publications mentioned above deal with backscattering problems by considering the plural layer structure of the lower layers, these methods are all limited to simplified methods. More particularly, the effect on the adjoining areas, which results from the backscattering of electrons in the plurality of layers below the resist layer, has not been considered. Accordingly, such methods cannot provide an accurate determination of the backscattering intensity in which the effects of a plural layer structure are considered.

It is accordingly an object of the present invention to provide a method that makes it possible to determine the backscattering intensity accurately by considering the effects of a complex multi-layered structure below the resist layer, and to provide an exposure method that uses this method to perform proximity effect correction, and a method for fabricating a semiconductor device.

It is a further object of the present invention to provide a method that makes it possible to determine the backscattering intensity accurately and in a manner allowing the computation time to be shortened, by considering the effects of a complex multi-layered structure below the resist layer, and to provide an exposure method that uses this method to perform proximity effect correction, and a method for fabricating a semiconductor device.

In order to achieve the above objects, a first aspect of the present invention is a method for generating the backscattering intensity with which charged particles are backscattered to a resist layer when a charged particle beam is irradiated onto the resist layer which is formed on a plurality of layers, each of which includes a pattern of one substance or a plurality of substances, wherein, with respect to the $n^{th}$ layer from the resist layer among the plurality of layers, there is provided, for each of the substances contained in the $n^{th}$ layer, a reflection coefficient rn, which corresponds with the number of particles reflected by the $n^{th}$ layer among those charged particles transmitted by the $(n-1)^{th}$ layer; a transmission coefficient tn, which corresponds with the number of particles transmitted by the $n^{th}$ layer among the charged particles reaching the $n^{th}$ layer; and a scatter distribution in which the charged particles are scattered within the $n^{th}$ layer; the generation method comprises a first step of generating the backscattering intensity by using the reflection coefficient rn, the transmission coefficient tn, and the scatter distribution.

According to a more preferable embodiment of the above aspect of the invention, in the first step, the charged particle scattering intensity which is the main cause of the backscattering intensity is generated by using the reflection coefficient rn, the transmission coefficient tn, and the scatter distribution, for each layer of the plurality of layers.

In addition, according to a more preferable embodiment of the above aspect of the invention, in the first step, with respect to a predetermined focus area of the $n^{th}$ layer, surface integration is performed on the charged particle scattering intensity from the surrounding area that includes the focus area, in accordance with the surface area density an of the substance(s) in the $n^{th}$ layer, and the distance coefficient an determined from the scatter distribution and corresponding with the distance between the surrounding area and the focus area.

Furthermore, according to a more preferable embodiment of the above aspect of the invention, the charged particle scattering intensity of the first step includes (1) a downwardly transmitted charged particle intensity determined by multiplying the transmission coefficient tn by a first charged particle intensity transmitted by the $(n-1)^{th}$ layer, and (2) a third charged particle intensity, which is determined by adding a reflected charged particle intensity determined by multiplying the reflection coefficient rn by the first charged particle intensity and an upwardly transmitted charged particle intensity determined by multiplying the transmission coefficient tn by a second charged particle intensity returning from the $(n+1)^m$ layer.

Further, according to a more preferable embodiment of the above aspect of the invention, the first step with respect to the $n^{th}$ layer is performed recursively from the first layer to the lowest layer of the plurality of layers, and the third charged particle intensity determined in the first layer below the resist layer is the backscattering intensity.

In order to achieve the above objects, a second aspect of the present invention is a program that causes a computer to execute a procedure that generates the above-mentioned charged particle backscattering intensity.

Furthermore, in order to achieve the above objects, a third aspect of the present invention is a semiconductor device fabrication method that comprises a step in which exposure is performed by means of exposure data that is generated by a proximity effect correction step that includes the above step of generating the charged particle backscattering intensity.

According to the above first aspect, the backscattering intensity toward the resist layer is determined by considering the charged-particle reflection coefficient and transmittance coefficient of the multi-layered structure of the layers below the resist layer. Therefore, the influence on the surroundings that is exerted by the scattering of the charged particles in each layer is also considered and the backscattering intensity can be more precisely determined. Further, because the distribution of the downwardly transmitted charged particle intensity, the reflected and transmitted charged particle intensity, and the upwardly transmitted charged particle intensity are simply determined by considering the number of transmitted charged particles and the number of reflected charged particles in each layer, the computation step performed by a computer can be simplified and hence the computation time can be shortened.

BRIEF DESCRIPTION OF THE DRAWINGS

FIG. 7 is a graph showing the parameters of each layer in FIG. 5;

DESCRIPTION OF THE PREFERRED EMBODIMENTS

The preferred embodiments of the present invention will be described hereinbelow. However, the technological scope of the present invention is not limited to these embodiments and covers the items defined in the claims as well as any equivalents thereof. The present invention is applied to a charged particle beam exposure. However, an electron beam exposure, which constitutes an example of charged particle beam exposure, will be described hereinbelow as an example. Therefore, electrons are illustrated to exemplify charged particles and an electron beam is illustrated to exemplify a charged particle beam.

[The Overall Process of This Embodiment]

Figure 1:
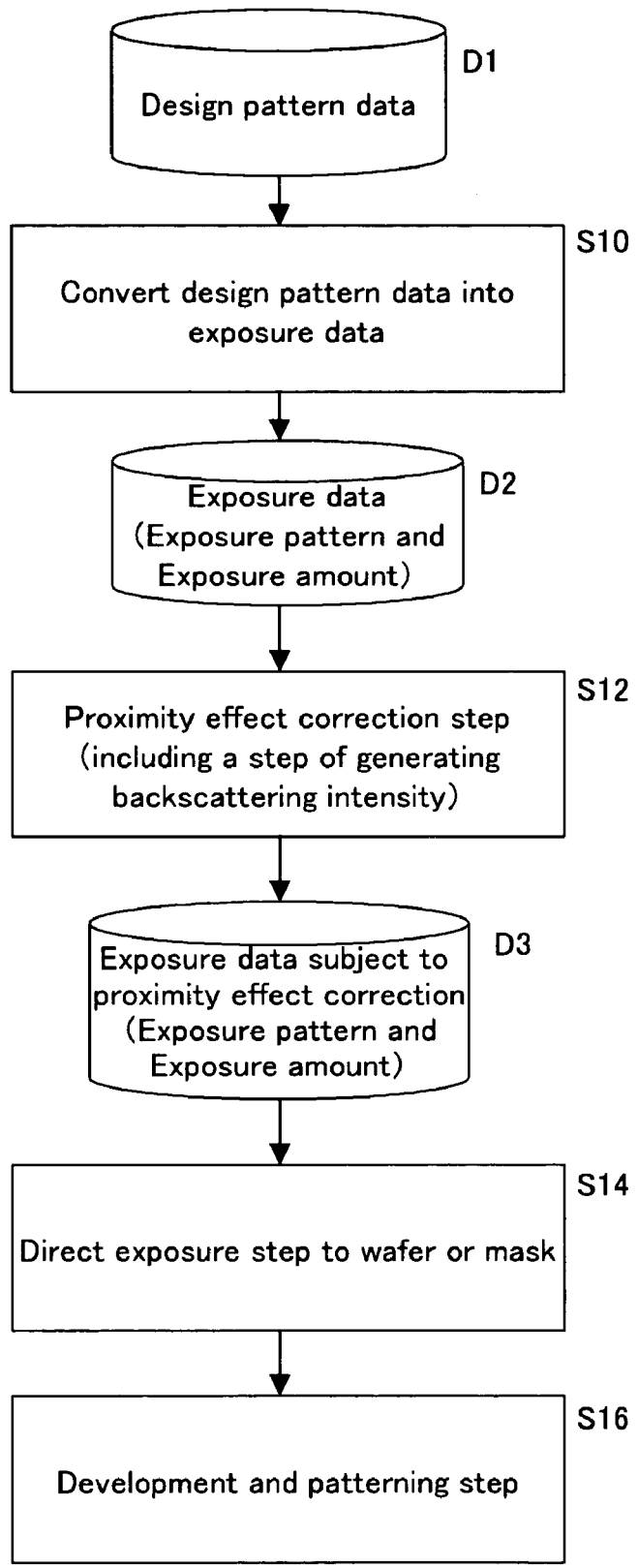
FIG. 1 is a flowchart of the exposure and development steps of the semiconductor device fabrication method according to this embodiment.

FIG. 1 is a flowchart of the exposure and development steps of the semiconductor device fabrication method of this embodiment. Design pattern data D1 generated by an integrated circuit design tool contains the substance or material to be processed as well as the corresponding pattern data and is converted into exposure data D2 that includes the exposure pattern and exposure amount (S10). That is, the exposure data includes the exposure amount of each shot of the electron beam exposure, and the pattern data for each shot. This electron beam exposure may be any of the following: the above-mentioned point beam exposure, a variable shaped beam exposure, a partial batch exposure method, and a projection-type exposure method. However, when the projection-type exposure method is used, the exposure amount is fixed independently of the pattern.

When a design value based pattern is exposed using a design value-based exposure amount, a variation in the development pattern is brought about by the proximity effect as mentioned earlier. Therefore, as a result of a proximity effect correction step that corrects either one or both the exposure pattern and exposure amount by considering the proximity effect, exposed data D3 that has undergone proximity effect correction is generated (S12). The proximity effect correction step S12 includes a step of generating the backscattering intensity highly accurately. Further, the semiconductor wafer or mask is subjected to the electron beam exposure by means of an exposure device (S14) in accordance with the corrected exposure data D3, where upon the exposed resist is developed and the layer below the resist layer is patterned (S16). Films undergoing patterning include, for example, a wiring layer of Al or Cu or the like, and a viahole layer of W or Cu, or the like.

As shown in FIG. 1, the step of determining the electron backscattering intensity is executed in the proximity effect correction step S12. A desired semiconductor device is fabricated by using the exposure, development and patterning steps shown in FIG. 1.

[Principle Behind the Method for Determining the Backscattering Intensity of this Embodiment]

Figure 2:
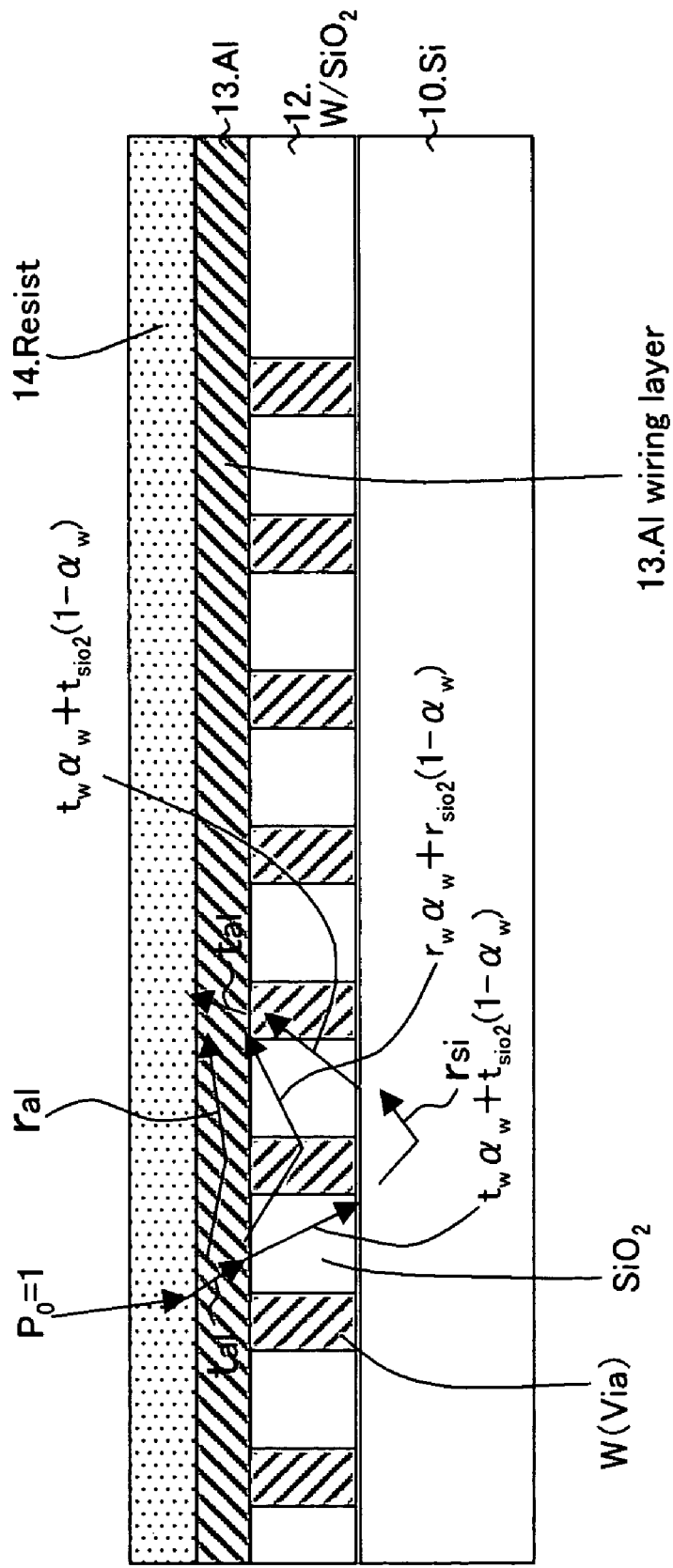
FIG. 2 is an explanatory view of the backscattering intensity determination method of this embodiment.

FIG. 2 is an explanatory view of the method for determining the backscattering intensity of this embodiment. In this example, a W/SiO$_2$ layer 12 having W contact holes with a pattern density α in the SiO$_2$ film is formed on a silicon substrate 10, and a resist layer 14 is formed on an unpatterned Al layer 13 that is formed on the W/SiO$_2$ layer 12. That is, the model in FIG. 2 is a model in which a multi-layered structure consisting of the Al layer 13, the W/SiO$_2$ layer 12, and a silicon substrate 10 is present below the resist layer 14 that is to be exposed and developed. In the case of this structure, the method used to determine the backscattering intensity when the resist layer 14 is irradiated with an electron beam will be described. For the purpose of simplification, the assumption has been made that the electrons entering the resist layer 14 are scattered and spread in the uniform resist layer and in the Al wiring layer, before reaching the W/SiO$_2$ layer, such that, even though electrons are scattered in the resist layer and Al layer, most of the electrons escape to below these layers such that only the direction of these electrons is changed.

Accordingly, when the Al layer 13 is formed on the W/SiO$_2$ layer 12 formed with contact holes, and wiring exposure is then performed on the resist layer 14 above the Al layer 13, three-fold electron backscattering may occur: 1) electrons returning after being reflected by the Al layer 13; 2) electrons returning after being transmitted by the Al layer 13 and then reflected by the W/SiO$_2$ layer 12; 3) electrons returning to the resist after being transmitted by the Al layer 13 and W/SiO$_2$ layer and then reflected by the silicon substrate 10 below the W/SiO$_2$ layer 12. Accordingly, when a single electron enters a certain layer, the ratio r of those electrons returning from this film and the ratio t of those electrons reaching the underside of this film after being transmitted thereby are defined. In other words, the reflection ratio $r_w$ and transmittance ratio $t_{al}$ of the Al layer 13, the reflection ratio $r_w$ and transmittance ratio $t_w$ of the W of the W/SiO$_2$ layer 12, the reflection ratio $r_{sio2}$ and transmittance ratio $t_{sio2}$ of SiO$_2$, and the reflection ratio $r_{si}$ of the silicon substrate 10 are defined. Further, it is assumed that the pattern density of the W contact holes of the W/SiO$_2$ layer 12 is $\alpha_w$, and that the pattern density of SiO$_2$ is (1-$\alpha_w$). Furthermore, for the purpose of simplification, as per the above-mentioned assumption, the assumption is made that the pattern density of the W/SiO$_2$ layer 12 is uniform over the whole surface. Here, the numbers of electrons in the three cases mentioned above are as follows.

In case (1), the number of electrons (electron intensity) is simply rendered by $r_{al}$. In case (2), because electrons are transmitted by the Al layer 13, scattered by the W/SiO$_2$ layer 12, and then transmitted once again by the Al layer 13, the number of electrons ultimately returning to the resist is determined as $t_{al} \times [r_w \alpha_w + r_{SiO2}(1-\alpha_w)] \times t_{al}$. In case (3), electrons are transmitted by the Al layer 13, pass through the W or SiO$_2$ and are then reflected by the Si substrate 10, before once again escaping the W or SiO$_2$ and the Al layer 13 and returning to the resist layer. Accordingly, the number of electrons is $t_{al} \times [t_w \alpha_w + t_{SiO2}(1-\alpha_w)] \times r_{si} \times [t_w \alpha_w + t_{SiO2}(1-\alpha_w)] \times t_{al}$. Therefore, the Al has a low specific gravity as well as a thin film thickness, and hence, assuming that $r_{al}$=0 and $t_{al}$=1, the ultimate backscattering intensity is determined as per $$r_w\alpha_w + t_w^2\alpha_w^2 r_{Si} + 2t_w t_{SiO2}\alpha_w(1-\alpha_w)r_{si} + t_{SiO2}^2(1-\alpha_w)^2 r_{si} + r_{SiO2}(1-\alpha_w) \quad (3)$$

by finding the total of the numbers of electrons in the three cases above.

Next, although the description above is based on the premise that the area densities of the exposure pattern and the contact hole are uniform, in the actual model, these area densities vary according to the area and hence the effect on the surrounding area caused by the scattering of electrons is also different. Therefore, in order to determine the backscattering intensity by considering area densities that vary according to these areas, it is necessary to determine the distribution of the numbers of electrons by using the area density method mentioned in the above mentioned J. Vac. Sci. Technol. B. Vol. 10, No. 6, pages 3072 to 3076 (1992).

Figure 3:
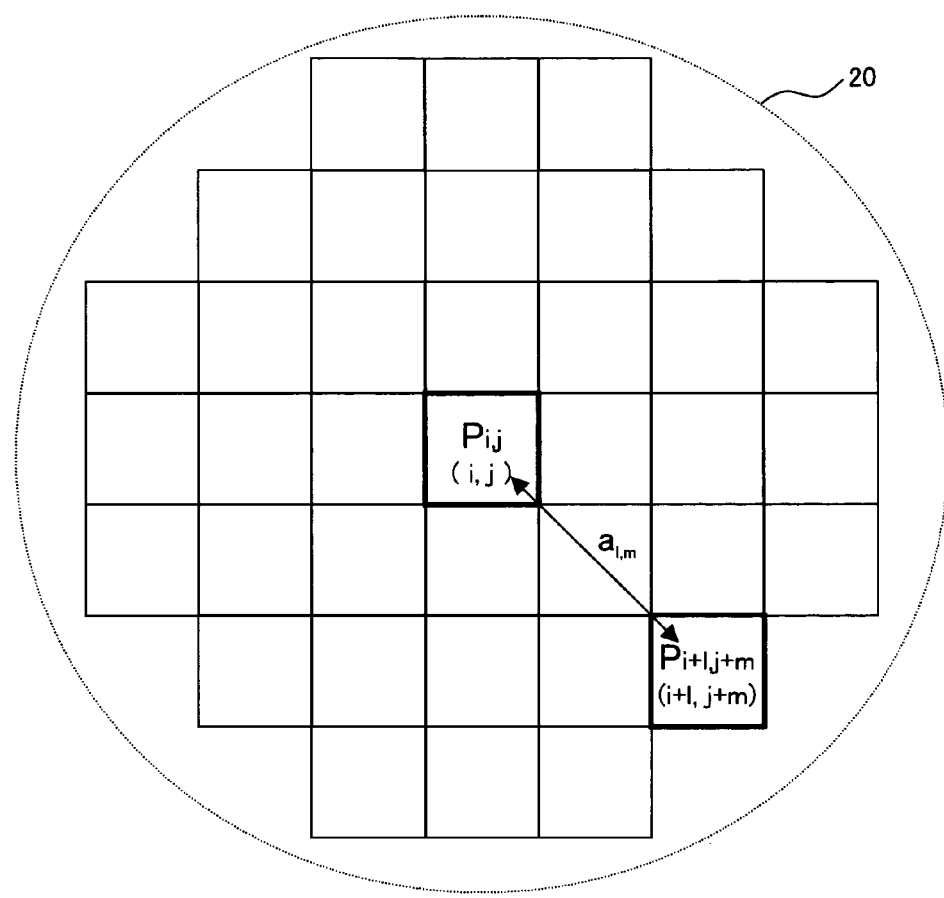
FIG. 3 illustrates the area density method.

FIG. 3 illustrates the area density method. According to the area density method, the number of electrons in an observed area (i,j) is determined by forming a plurality of areas by dividing up each layer in the form of a mesh and then accumulating the number of electrons scattered from the surrounding areas (i+l, j+m) within an area 20 that is demarcated by the electron scatter length with respect to the observed area (i, j). In this case, the distribution of the spreading caused by the electron scattering is such that the number of influential electrons decreases the longer the scatter distance becomes, as per a Gaussian distribution, for, example. Therefore, the scatter distribution, which is dependent on this distance, is defined as the distance coefficient $a_{l,\,m}$. In this case the number f electrons $P'_{i,j}$ of the area (i,j) is affected by the scattering of the electron quantity $P_{i+l,j+m}$ reaching the surrounding areas (i+l,j+m) and is determined by the addition $$p'_{i,j} = \sum_l \sum_m a_{l,m} \times p_{i+l,j+m} \quad (4)$$

shown in FIG. 3. Surface integration is performed substantially accordingly.

Accordingly, in the case of this embodiment the respective scatter lengths of the electrons in each layer are defined as $\sigma_{Al}$, $\sigma_w$, and $\sigma_{SiO2}$. Further, the weighting coefficients of the distances corresponding with these scatter lengths are defined as $a_{Al}$, $a_w$, and $a_{SiO2}$. Initially, the electrons entering the Al layer 13 reach the underside of the Al layer while being scattered within the Al layer. Therefore, the electron distribution at the underside of the Al layer is a distribution that is produced by subjecting the incident electron distribution to the surface integration in which the range lies within a $\sigma_{Al}$ Gaussian distribution. Accordingly, the electron distribution $P_{0i,j}$ at the underside of the Al layer is determined for each area by using the above-mentioned area density method.

As illustrated in FIG. 2, $rw\alpha w_{i,j} + r_{SiO2}(1-\alpha w_{i,j})$ in the electron distribution $P_{0i,j}$ at the underside of the Al layer is reflected by the W/SiO$_2$ layer 12 and returns above same, while $tw\alpha w_{i,j} + t_{SiO2}(1-\alpha w_{i,j})$ reaches the underside of the W/SiO$_2$ layer 12 while being scattered by the W and SiO$_2$. Therefore, the electron distribution $P_{1i,j}$ reaching the underside of the W/SiO$_2$ layer 12 is similarly determined to be $$p_{1i,j} = \sum_l \sum_m p_{0i+l,j+m} \{a_{Wl,m} t_w \alpha w_{i+l,j+m} + a_{SiO2l,m} t_{SiO2}(1 - \alpha w_{i+l,j+m})\} \quad (5)$$

by means of the area density method. Here, because the electron scatter length is different for each substance, the distance coefficients $aw_{l,m}$ and $a_{SiO2l,m}$ also vary from substance to substance.

In addition, the electrons, which have reached the underside of the W/SiO2 layer 12; are scattered by the bulk silicon substrate 10 and spread, before reaching the underside of the W/SiO$_2$ film once again. The electron distribution $P_{1i,j}'$ at this time is rendered by the equation below.

$$p'_{1i,j} = \sum_l \sum_m p_{1i+l,j+m} r_{Si} a_{Si,l,m} \quad (6)$$

Furthermore, among the electrons $P_{1i,j}'$ reaching the underside of the W/SiO$_2$ layer, electrons $P_{2i,j}'$, which come to return to the interface between the Al layer 13 and the W/SiO$_2$ layer 12, are those electrons that are transmitted while spreading at the scatter lengths σw and $\sigma_{SiO2}$ within the W/SiO$_2$ layer 12, combined with those electrons which are scattered within the W/SiO$_2$ film 12 and reflected thereby. The number of these electrons is $P_{2i,j}'$.

$$p'_{2i,j} = \sum_l \sum_m \begin{bmatrix} p'_{1i+l,j+m}\{t_W a_{Wl,m}\alpha_{Wi+l,j+m} + \\ t_{SiO2} a_{SiO2l,m}(1-\alpha_{Wi+l,j+m})\} + \\ p'_{0i+l,j+m}\{r_W a_{Wl,m}\alpha_{Wi+l,j+m} + \\ r_{SiO2} a_{SiO2l,m}(1-\alpha_{Wi+l,j+m})\} \end{bmatrix} \quad (7)$$

Further, the distribution of the electrons reaching the upper surface of the Al layer 13 is such that the electron quantity $P_{2i,j}'$ in Equation (7) spreads out at the scatter length $\sigma_{Al}$, and hence the scattering within the Al layer 13 is found by the area density method and the distribution Intensity$_{i,j}$ of this electron intensity is determined as $$Intensity_{i,j} = \sum_l \sum_m p'_{2i+l,j+m} a_{All,m} \quad (8)$$

The assumption is made that, although repetition occurs, all the electrons are transmitted within the Al layer and not reflected as a precondition of the above example.

Figure 4:
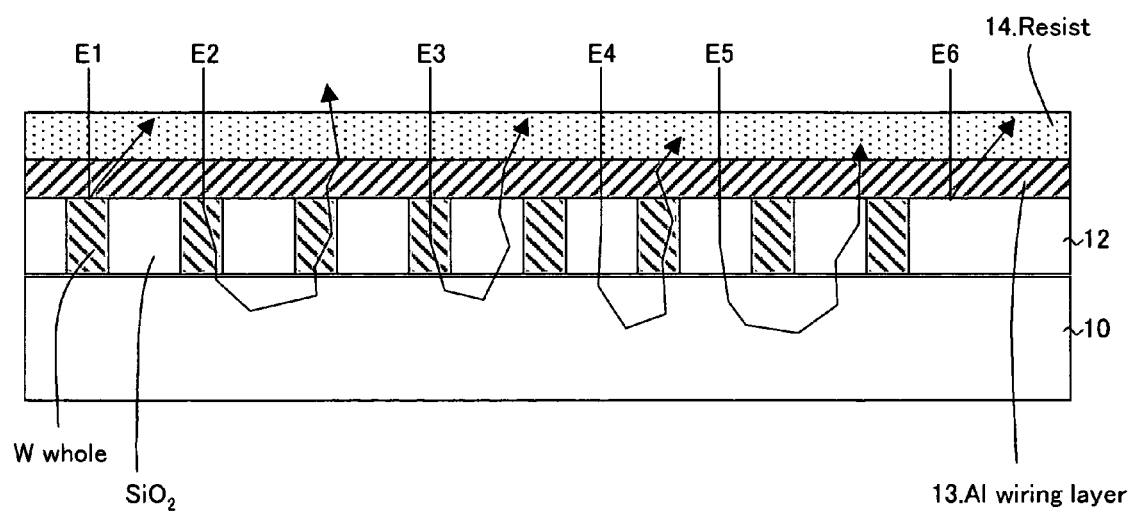
FIG. 4 shows types of backscattered electrons.

The intensity distribution of the electrons that return to the resist layer 14 according to the above principle can be verified from a different standpoint. FIG. 4 shows types of backscattered electrons. In the case of a multi-layered structure that is the same as in FIG. 2, among the electrons that enter the W/SiO$_2$ mixed layer 12, the trajectories of the electrons that return to the resist can be classified into the following six trajectories shown in FIG. 4 given substantial simplification.

(1) Electrons E1 that [emerge from W after being reflected by W]; (2) electrons E2 that [emerge from w after passing through W]; (3) electrons E3 that [emerge from SiO$_2$ after passing through W]; (4) electrons E4 that [enter the SiO$_2$ and emerge from the W]; (5) electrons E5 that [enter the SiO$_2$ and emerge from the SiO$_2$]; (6) electrons E6 that [emerge from SiO$_2$ after being reflected by same].

The numbers of the electrons E1 to E6 are determined based on the following perspective.

It is thought that if the incident electrons are adequately scattered and spread in the resist film 14 and Al layer 13, the electron distribution at the upper surface of the W/SiO$_2$ layer 12 is substantially uniform and either the electrons entering the W or the electrons entering the SiO$_2$ are dependent on the area ratio of the W and SiO$_2$. Some of the electrons entering the W and SiO$_2$ and so forth are reflected thereby and some are transmitted thereby, in accordance with the respective transmittances of the W and SiO$_2$. Supposing that the transmittances of the W and SiO$_2$ films are $T_w$ and $T_{SiO2}$ respectively and that the area ratios are $\alpha_w$ and $1-\alpha_w$, the number of returning electrons that are reflected by the W after entering same, for example, is determined as $\alpha_w(1-T_w)$. On the other hand, similarly to a case where the electrons return, the number of electrons can be determined via the area ratios and transmittances of the W and SiO$_2$. As a result, assuming that the number of incident electrons is 1, the number of electrons returning to the upper surface of the W and SiO$_2$ is expressed by way of the following equations.

(1) Probability of emerging after being reflected by W: as $\alpha_w(1-T_w)$;

(2) Probability of emerging from W after passing through W: $\alpha_w T_w \times \alpha_w T_w$;

(3) Probability of emerging from SiO$_2$ after passing through W: $\alpha_w T_w \times (1-\alpha_w) T_{SiO2}$;

(4) Probability of emerging from W after entering SiO$_2$: $(1-\alpha_w)T_{SiO2} \times \alpha_w T_w$ (5) Probability of emerging from SiO$_2$ after entering SiO$_2$: $(1-\alpha_w)T_{SiO2} \times (1-\alpha_w) T_{SiO2}$; and (6) Probability of emerging after being reflected by SiO$_2$: $(1-\alpha_w)(1-T_{SiO2})$.

The energy which the electrons E1 to E6, having undergone the six processes above, impart to the resist is thought to be different depending on the scatter process. This is because the average energy of the electrons may vary depending on the scattering and therefore the effective resist sensitivity (exposure sensitivity of the resist with respect to the energy of the electrons) may vary. Accordingly, when the energy, which the electrons that have undergone these processes impart to the resist, is defined as $e_1$ to $e_6$, the sum total of the backscattering, which the resist layer is subjected to when the resist layer is exposed in order to form Al wiring with a density α, is determined as follows.

$$\alpha \begin{Bmatrix} \alpha_w(1-T_w)e_1 + \alpha_w^2 T_w^2 e_2 + \alpha_w T_W(1-\alpha_w)T_{SiO2}e_3 + \\ (1-\alpha_w)T_{SiO2}\alpha_w T_w e_4 + (1-\alpha_w)^2 T_{SiO2}^2 e_5 + \\ (1-\alpha_w)(1-T_{SiO2})e_6 \end{Bmatrix} \quad (9)$$

In order to simplify Equation (9) above, supposing that $(1-T_w)e_1=\eta_1$, $T_w^2 e_2=\eta_2$, $T_w T_{SiO2} e_3=\eta_3$, $T_{SiO2}T_w e_4=\eta_4$, $T_{SiO2}^2 e_5=\eta_5$, and $(1-T_{SiO2})e_6=\text{o}_6$, Equation (9) reads as follows.

$$\alpha\{\alpha_w \eta_1 + \alpha_w^2 \eta_2 + \alpha_w(1-\alpha_w)\eta_3 + \alpha_w(1-\alpha_w)\eta_4 + \\ (1-\alpha_w)^2 \eta_5 + (1-\alpha_w)\eta_6\} \quad (10)$$

$\eta_1$ to $\eta_6$ are equations that are created by crossing, for each path, the reduction in the number of electrons within the W film or SiO$_2$ film with the resist sensitivity, and express the energy imparted to the resist when a single electron travels these paths.

Furthermore, Equations (9) and (10) above are based on the premise that the density α of the Al wiring and the density $\alpha_w$ of the W contact holes are uniform. The energy in an observed area can be determined by considering the influence exerted by the scattering of electrons from the surrounding regions by considering the density by means of the area density method as per the model in FIG. 2. However, upon application to structures of two or more layers, Equation (10) is somewhat more complex and hence inferior in terms of its utility.

When Equations (3) and (10) are compared, both have exactly the same form relative to the area ratios $\alpha_w$ and $1-\alpha_w$. Since both equations should of course be equal, the parameters that apply to these equations are related as follows.

$$r_w = \eta_1 \tag{11}$$

$$t_w^2 r_{Si} = \eta_2 \tag{12}$$

$$2t_w t_{SiO2} r_{Si} = (\eta_3 + \eta_4) \tag{13}$$

$$t_{SiO2}^2 r_{Si} = \eta_5 \tag{14}$$

$$r_{Si} = \eta_6 \tag{15}$$

In light of these relationships, it can be seen that, in the model in FIG. 4, the parameters are represented by the product of the electron quantity and the energy these electrons impart to the resist, whereas, in the case of the model in FIG. 2, the parameters are represented by only parameters relating to the electron quantity such as the reflected electron quantity r as well as the number of transmitted electrons t relative to the incident electrons. In other words, this means that, although the effective resist sensitivity varies according to the path of the scattered electrons in the model of FIG. 4, in the case of the model in FIG. 2, the number of electrons is considered to have changed. Because the reflectance r and the transmittance t and so forth do not express a simple electron number, r+t is not necessarily limited at 1.

As described above, it has been verified that the model in FIG. 2 is substantially the same as the model in FIG. 4.

[Example in Which the Invention is Applied to a Plural-Type Layer Structure]

Figure 5:
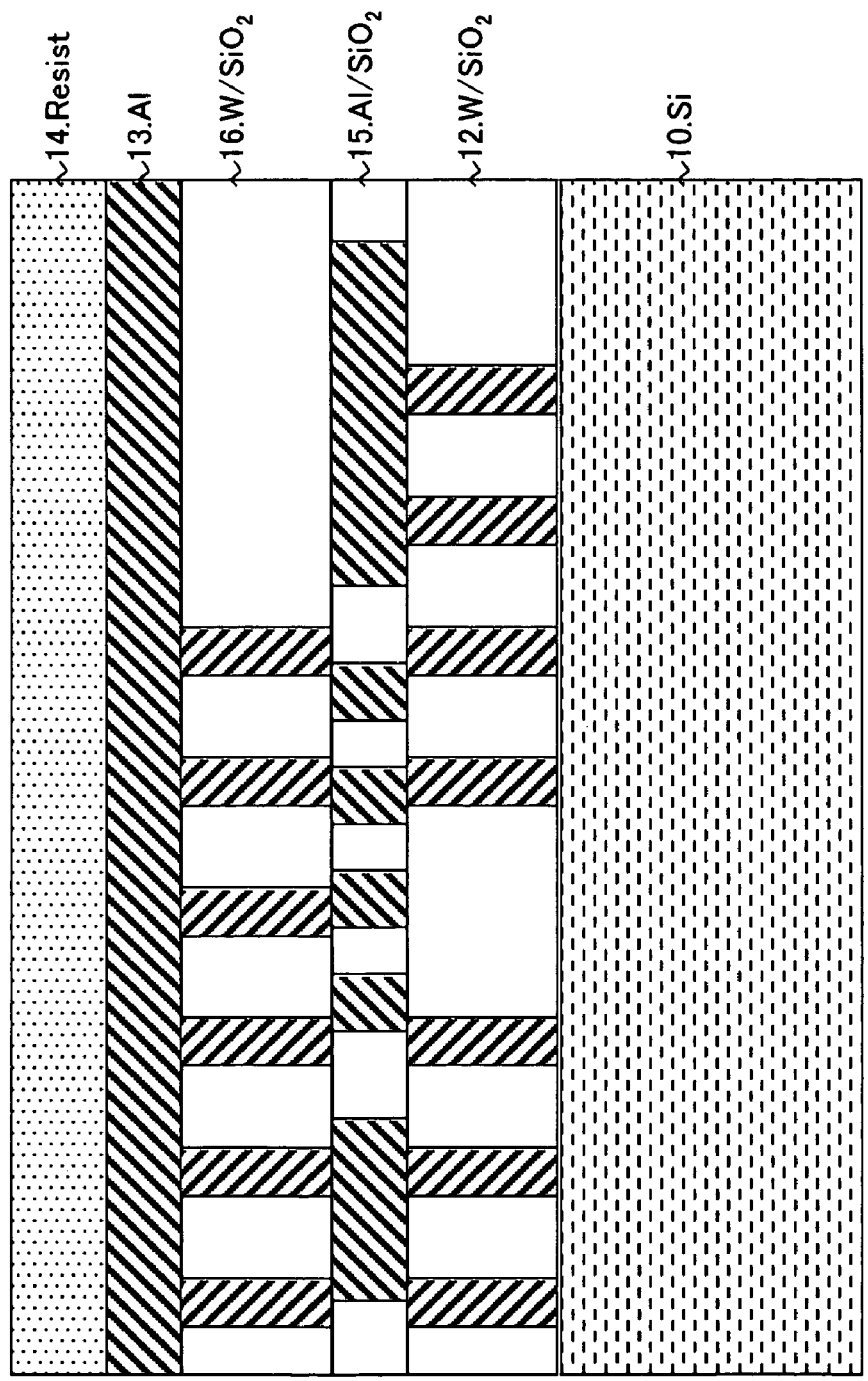
FIG. 5 is a cross-sectional view of the plural-type layer structure of this embodiment.
Figure 6:
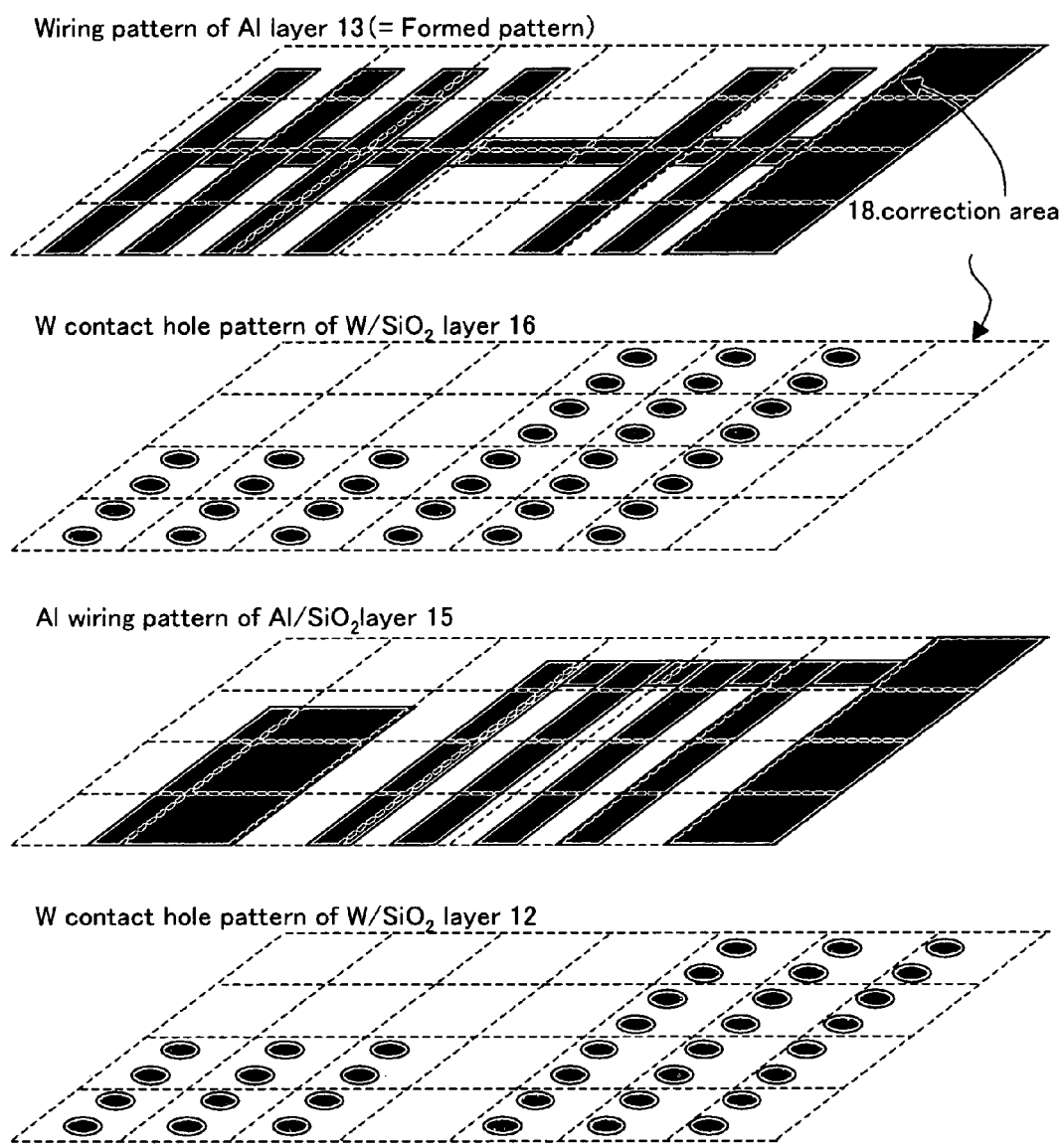
FIG. 6 is an expanded view of each layer in FIG. 5.

Next, a description will be provided for an example in which this embodiment is applied to a plural-type layer structure made by further extending the model in FIG. 2. FIG. 5 is a cross-sectional view showing the plural-type layer structure of this embodiment. FIG. 6 is an expanded view of each layer in FIG. 5, and FIG. 7 is a graph showing the parameters of each layer.

The layered structure of FIG. 5 is, moving from the top, the resist layer 14, the Al wiring layer 13, a W/SiO$_2$ layer 16, an Al/SiO$_2$ wiring layer 15, the W/SiO$_2$ layer 12, and the silicon substrate 10. As mentioned earlier, the reflection coefficient r, transmission coefficient t, and the distance coefficient a with respect to the scatter length σ act relative to the substances of each of the layers, and the distribution of electrons that ultimately return to the resist layer 14 is determined based on the idea that some of the electrons that enter each layer are reflected while being scattered and some are transmitted while being scattered.

Figure 8:
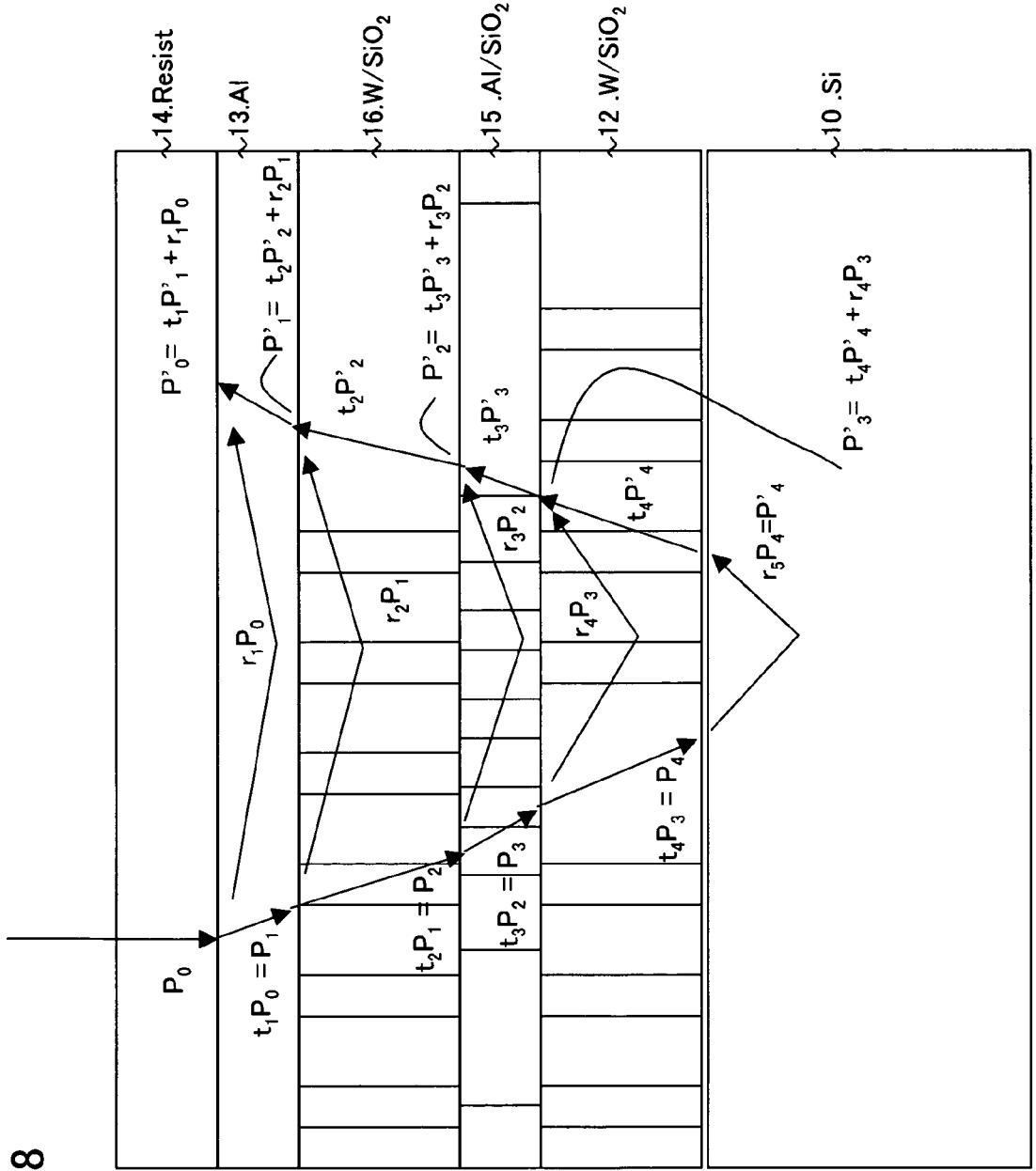
FIG. 8 shows an outline of the scattering of electrons entering the plural layer structure in FIG. 5.

FIG. 8 shows an outline of the scattering of electrons entering the plural layer structure in FIG. 5. The electrons entering the resist layer 14 are partially scattered forward and reach the interface between the resist layer and the Al layer. This electron quantity P0 is partially reflected and partially transmitted within the Al layer 13, and an electron quantity P1 reaches the interface between the Al layer 13 and the W/SiO$_2$ layer 16. The electron quantity P1 is also partially reflected and partially transmitted within the W/SiO$_2$ layer 16, and an electron quantity P2 reaches the interface between the W/SiO$_2$ layer 16 and the Al/SiO$_2$ layer 15. This electron quantity P2 is partially reflected and partially transmitted within the Al/SiO$_2$ layer 15 and an electron quantity P3 reaches the interface with the W/SiO$_2$ layer 12. This electron quantity P3 is also partially reflected and partially transmitted within the W/SiO$_2$ layer 12 and an electron quantity P4 reaches the silicon bulk 10. This electron quantity P4 is partially reflected within the silicon bulk 10, and an electron quantity P'4 reaches the underside of the W/SiO$_2$ layer 12. The electron quantity P'4 is partially transmitted by the W/SiO$_2$ layer 12. Accordingly, a total P'3, which consists of the electrons reflected by the layer 12 and those transmitted by this layer 12, reaches the underside of the Al/SiO$_2$ layer 15. Likewise, a total P'2, which consists of the electrons reflected by the layer 15 and the electrons transmitted by this layer 15, reaches the underside of the W/SiO$_2$ layer 16; a total P'1, which consists of electrons reflected by the layer 16 and the electrons transmitted by this layer 16, reaches the underside of the Al layer 13; and a total P'0, which consists of electrons reflected by the layer 13 and the electrons transmitted by this layer 13, reaches the underside of the resist layer 14. Therefore, those electrons that reach each layer from above or below are partially reflected and partially transmitted by each layer. The electrons that have reached the silicon bulk 10 are partially reflected and then rise up through the layers, ultimately reaching the resist layer 14. Further, the electron quantity P'0 is the backscattering intensity toward the resist 14.

In addition, the above electrons are scattered within each layer, and hence spread to the surrounding area within the range of the scatter length. Therefore, in order to consider the effects of the scattering, the amount of electrons in an observed area must be determined by applying the area density method described in FIG. 3. In order to apply the area density method, the pattern of each layer is divided into a correction area 18 with the dimensions A×A, as shown by the broken lines in the expanded view in FIG. 6. Further, the amount of electrons in this observed correction area is determined by performing surface integration on the scatter amount of the electrons from a plurality of areas within the surrounding area with respect to the observed correction area. The electron distribution of each layer will be determined more specifically below.

The electron quantity $P_{0i,j}$ irradiated onto the correction area (i,j) is first determined. The electron quantity $P_{0i,j}$ irradiated onto the correction area (i,j) is then determined based on the density at which the Al pattern of the Al layer 13 occupies the correction area. In this case, when the optimum exposure amount of the large area pattern with the largest backward scattering intensity is 1, exposure amount correction such as that the d times exposure amount is applied to a pattern whose surrounding pattern density is low, is considered a prerequisite. The exposure amount correction is defined in Japanese Laid open Patent Publication No. 2001-52999 (published on Feb. 23, 2001) and the corresponding American Patent (unregistered) above, and is also illustrated in an application example that will be described subsequently. When this exposure amount correction is considered, the corrected exposure amount to each exposure pattern is a multiple d of the optimum exposure amount "1". As a result, in a case where, in a certain correction area (i,j), a plurality of patterns is present, a kth pattern has a surface area density $α_k$, and a corrected exposure amount is $d_k$, the effective electron quantity (electron intensity) that is irradiated onto this area is determined as per:

$$p_{0i,j} = \sum_k d_k α_k \tag{16}$$

However, in the case of a projection exposure method that does not permit correction of the exposure amount for each pattern, the above-mentioned electron quantity is $d_k=1$.

Figure 9:
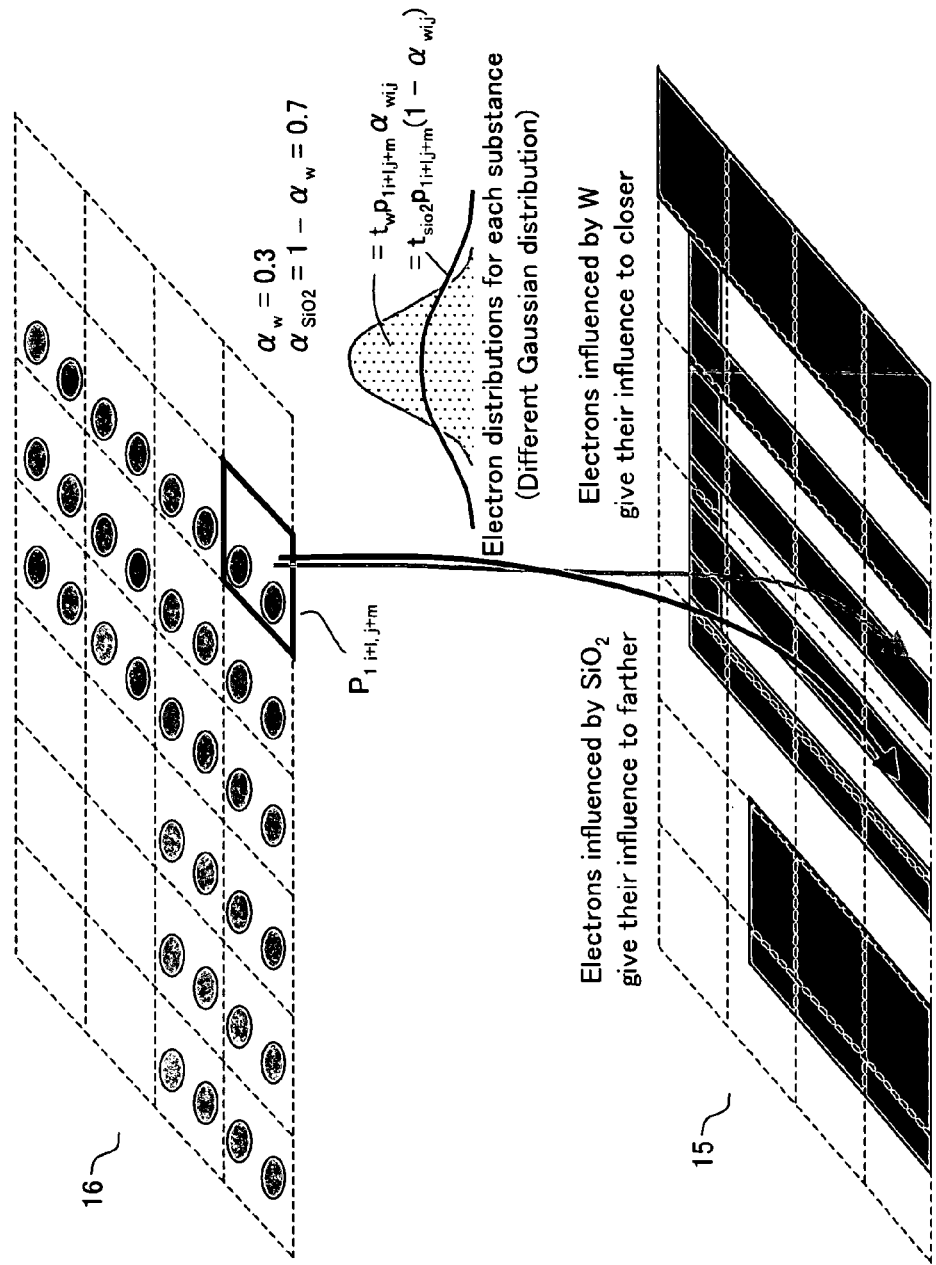
FIG. 9 serves to illustrate the area density method of this embodiment.

Next, the electrons that reach the interface of each layer will be sequentially determined by means of the area density method. FIG. 9 serves to illustrate the area density method of this embodiment. FIG. 9 illustrates, by way of example, a case where an electron distribution in which the electrons which have reached the upper surface the W/SiO$_2$ layer 16 of the second layer, reach the interface between the W/SiO$_2$ layer 16 and the Al/SiO$_2$ layer 15. In other words, electrons $P_{1\ i+l,\ j+m}$, which have reached the (i+l,j+m)th correction area, enter in an amount that corresponds to the W and SiO$_2$ area ratios αw and (1−αw) of the W/SiO$_2$ layer 16, and spread to the observed (I, j)th correction area after being scattered within the W and SiO$_2$. Further, the manner in which the electrons spread differs with regard to the electrons entering the W and those electrons entering the SiO$_2$. Therefore, the electron distribution at the interface between the W/SiO$_2$ layer 16 and the Al/SiO$_2$ layer 15 is determined by considering the extent of the spreading caused by the scattering of the electrons entering the W and the electrons entering the SiO$_2$, and then combining the effects by multiplying different distance coefficients $a_{Al}$ and $a_{SiO2}$ in the electron distribution $P_{1\ i+l,j+m}$. That is, the electrons $P_{1\ i+l,j+m}$, which have reached the (i+l, j+m)th correction area, enter the W and SiO$_2$ in accordance with the area ratios $αw_{i+l,j+m}$, and $(1−αw_{i+l,j+m})$ and spread to the observed (i, j)th correction area in accordance with the distance coefficients $a_{Al\ l,m}$ and $a_{SiO2\ l,m}$.

A determination of the distribution of the electrons reaching each interface in accordance with the ideas described above is as follows.

The distribution $P_{1\ i,j}$ of electrons reaching the interface between the Al layer 13 and the W/SiO$_2$ layer 16 is:

$$p_{1i,j} = \sum_l \sum_m p_{0i+l,j+m} t_{Al} a_{All,m} \qquad (17)$$

The distribution $P_{2\ i,j}$ of electrons reaching the interface between the W/SiO$_2$ layer 16 and the Al/SiO$_2$ layer 15 is:

$$p_{2i,j} = \sum_l \sum_m p_{1i+l,j+m} \{t_W \alpha_{Wi+l,j+m} a_{Wl,m} + \qquad (18)$$
$$t_{SiO2-1}(1 - \alpha_{Wi+l,j+m}) a_{SiO2-1l,m}\}$$

The distribution $P_{3\ i,j}$ of electrons reaching the interface between the Al/SiO$_2$ layer 15 and the W/SiO$_2$ layer 12 is:

$$p_{3i,j} = \qquad (19)$$
$$\sum_l \sum_m p_{2i+l,j+m} \{t_{Al} \alpha_{Ali+l,j+m} a_{All,m} + t_{SiO2-2}(1 - \alpha_{Ali+l,j+m}) a_{SiO2-2l,m}\}$$

The distribution $P_{4\ i,j}$ of electrons reaching the interface between the W/SiO$_2$ layer 12 and the Si substrate 10 is:

$$p_{4i,j} = \sum_l \sum_m p_{3i+l,j+m} \qquad (20)$$
$$\{t_W \alpha_{W2i+l,j+m} a_{Wl,m} + t_{SiO2-1}(1 - \alpha_{W2i+l,j+m}) a_{SiO2-1l,m}\}$$

The distribution $P_{4\ i,j}'$ of electrons that enter the Si substrate 10 and return to the interface between the Si substrate 10 and the W/SiO$_2$ layer 12 is:

$$p_{4i,j}' = \sum_l \sum_m p_{4i+l,j+m} r_{Si} a_{Sil,m} \qquad (21)$$

The distribution $P_{3\ i,j}'$ of electrons that return to the interface between the W/SiO$_2$ layer 12 and the Al/SiO$_2$ layer 15 is:

$$p_{3i,j}' = \sum_l \sum_m \begin{bmatrix} p_{4i+l,j+l}'\{t_W \alpha_{W2i+l,j+m} a_{Wl,m} + \\ t_{SiO2-1}(1 - \alpha_{W2i+l,j+m}) a_{SiO2-1l,m}\} + \\ p_{3i+l,j+l}\{r_W \alpha_{W2i+l,j+m} a_{Wl,m} + \\ r_{SiO2-1}(1 - \alpha_{W2i+l,j+m}) a_{SiO2-1l,m}\} \end{bmatrix} \qquad (22)$$

The distribution $P_{2\ i,j}'$ of electrons that return to the interface between the Al/SiO$_2$ layer 15 and the W/SiO$_2$ layer 16 is:

$$p_{2i,j}' = \sum_l \sum_m \begin{bmatrix} p_{3i+l,j+l}'\{t_{Al} \alpha_{Ali+l,j+m} a_{All,m} + \\ t_{SiO2-2}(1 - \alpha_{Ali+l,j+m}) a_{SiO2-2l,m}\} + \\ p_{2i+l,j+l}\{r_{Al} \alpha_{Ali+l,j+m} a_{All,m} + \\ r_{SiO2-2}(1 - \alpha_{Ali+l,j+m}) a_{SiO2-2l,m}\} \end{bmatrix} \qquad (23)$$

The distribution $P_{1\ i,j}'$ of electrons that return to the interface between the W/SiO$_2$ layer 16 and the Al layer 13 is:

$$p_{1i,j}' = \sum_l \sum_m \begin{bmatrix} p_{2i+l,j+l}'\{t_W \alpha_{Wi+l,j+m} a_{Wl,m} + \\ t_{SiO2-1}(1 - \alpha_{Wi+l,j+m}) a_{SiO2-1l,m}\} + \\ p_{1i+l,j+l}\{r_W \alpha_{Wi+l,j+m} a_{Wl,m} + \\ r_{SiO2-1}(1 - \alpha_{Wi+l,j+m}) a_{SiO2-1l,m}\} \end{bmatrix} \qquad (24)$$

The distribution $P_{0\ i,j}'$ of electrons that return to the interface between the Al layer 13 and the resist layer 14 is:

$$p_{0i,j}' = \sum_l \sum_m [p_{1i+l,j+l}' t_{Al} a_{All,m} + p_{0i+l,j+l} r_{Al} a_{All,m}] \qquad (25)$$

That is, the backscattering intensity that ultimately returns to the resist layer 14 is $P_{0\ i,j}'$ of Equation (25).

As detailed above, in the case of the multi-layered structure model in FIGS. 5 and 6, if respective layer parameters (see FIG. 7) which are determined beforehand via experimentation and so forth are assigned, the number of electrons that reach the resist layer 14 can be subjected to the surface integration in accordance with the area ratios of each layer and the distance coefficient corresponding with the scatter length, whereby the backscattering intensity returning to the resist layer can be determined for each correction area and the backscattering intensity distribution can be obtained. According to the above determination method, even when the number of layers in the multi-layered structure and the substances and materials that constitute each layer are different, it is possible to determine the backscattering intensity in the same manner.

[Generalized Method for Determining Backscattering Intensity]

Figure 10:
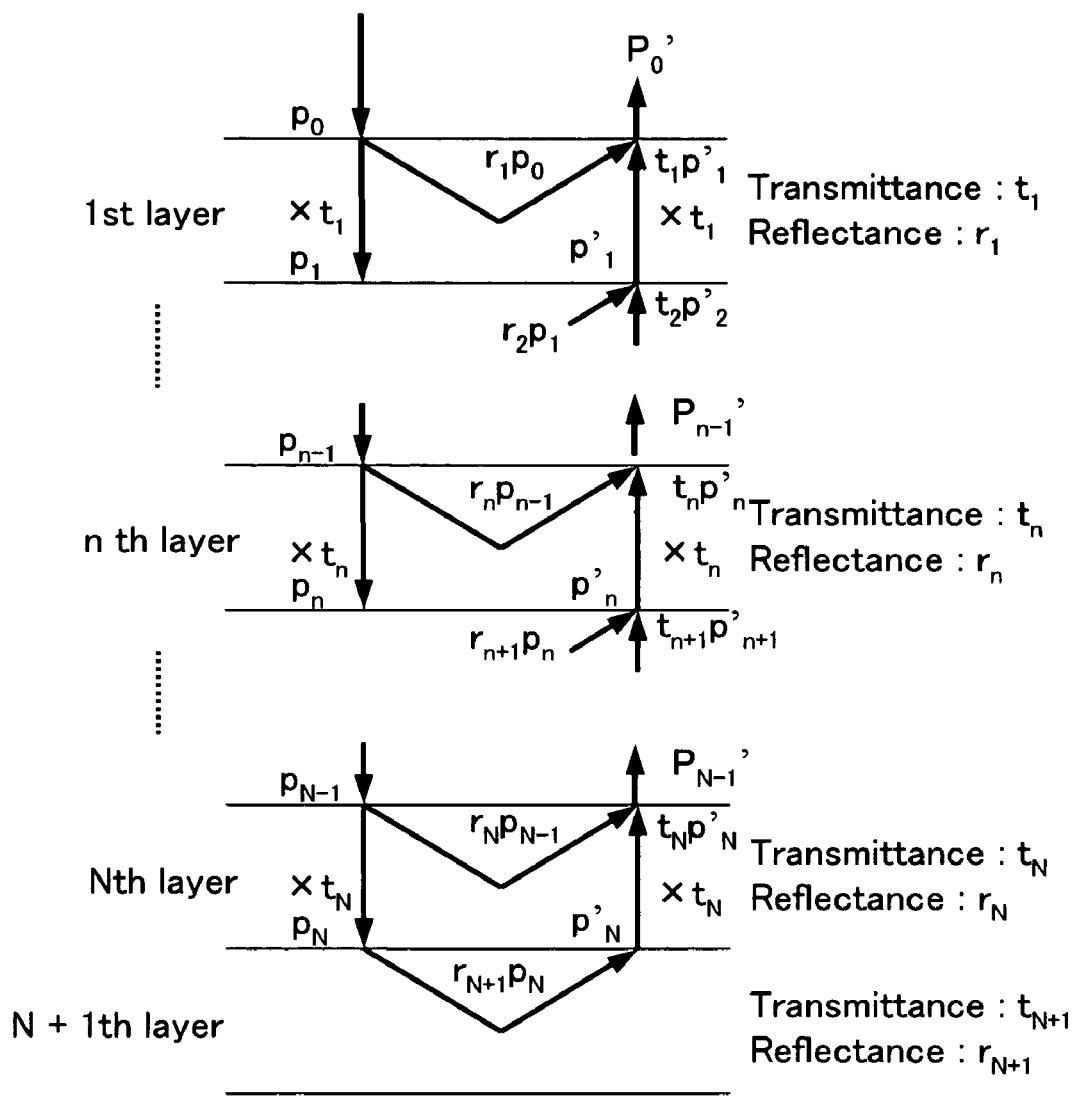
FIG. 10 serves to illustrate a generalized method for generating the backscattering intensity of this embodiment.

FIG. 10 serves to illustrate a generalized method for generating the backscattering intensity of this embodiment. FIG. 10 is a model in which a multi-layered structure consisting of N layers is formed on the $(N+1)^{th}$ silicon bulk substrate or other substrate, and a resist is then formed on this structure. Further, if the computation with respect to the $n^{th}$ layer is described for the purpose of a generalization, of the electron intensity (or electron quantity) $Pn-1$ which reaches the interface with the $n^{th}$ layer after being transmitted by the $(n-1)^{th}$ layer, an electron intensity $rn*Pn-1$ which corresponds with the reflectance $rn$ is reflected, and an electron intensity $tn*Pn-1$, which corresponds with the transmittance $tn$, is transmitted and reaches the $(n+1)^{th}$ layer. Accordingly, the electron intensity $Pn$, which reaches the $(n+1)^{th}$ layer is $Pn=tn*Pn-1$. Further, of the electron intensity $P'n$ that reaches the $n^{th}$ layer from below same, an electron intensity $tn*P'n$, which corresponds with the transmittance $tn$, is transmitted. Summation of the electron intensity $tn*P'n$ reflected and the electron intensity $rn*Pn-1$ reflected by the $n^{th}$ layer yields the electron intensity $P'n-1=tn*P'n+rn*Pn-1$ that reaches the $(n-1)^{th}$ layer of the upper layers. Further, as described earlier, the area ratio $\alpha$ of the substance constituting the $n^{th}$ layer, and the distance coefficient a corresponding with the electron scatter length are used as the parameters for the surface integration of the area density method.

However, when the computation for the $(n+1)^{th}$ layer is not performed, the electron intensity $P'n$ reaching the $n^{th}$ layer from below same cannot be determined. Accordingly the electron intensity $P'n-1$ that returns from the n layer to the interface with the $(n-1)^{th}$ layer can be determined by performing the above-mentioned calculation for the $n^{th}$ layer recurrently or recursively from the first to the $N^{th}$ layer. The recursive processing is a processing method that can be easily adapted for a program that is executed by a computer.

Figure 11:
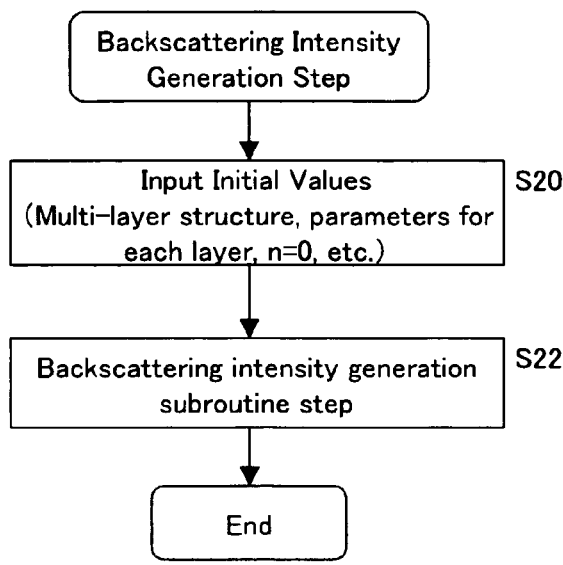
FIG. 11 is a flowchart for the step of generating the backscattering intensity.
Figure 12:
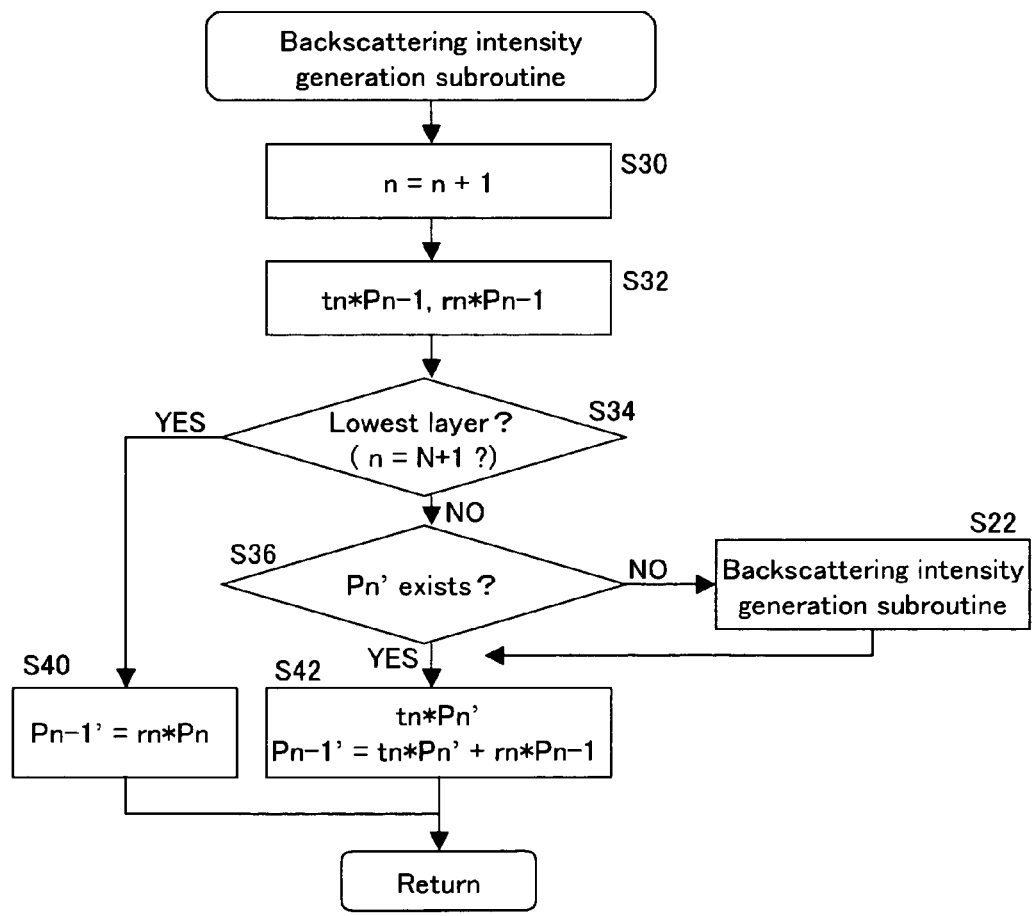
FIG. 12 is a flowchart for a backscattering intensity generation subroutine step.

FIG. 11 is a flowchart for the step of generating the backscattering intensity. Further, FIG. 12 is a flowchart for a backscattering intensity generation subroutine step. The notation for the integration calculation of the area density method has been omitted from this flowchart.

According to this embodiment, the backscattering intensity can be determined by means of computation that is performed by a program installed on a general purpose computer. Initial values for the model to be determined are initially entered by this program (S20). More specifically, the initial values are parameters (see FIG. 7) such as the layer structure of the model, the reflectance, transmittance and distance coefficient of each layer, the exposure intensity of each electron beam shot irradiated onto the resist, and an initial value n=0 for the number of layers, and so forth. The backscattering intensity generation subroutine step S22 is then executed.

Moving on to the subroutine in FIG. 12, the number of layers n is incremented (S30), and the transmitted electron intensity $Pn=tn*Pn-1$, which reaches the interface between the $n^{th}$ layer and the $(n+1)^{th}$ layer and the reflected electron intensity $rn*Pn-1$ in the $n^{th}$ layer are determined (S32) from the electron intensity $Pn-1$ reaching the $n^{th}$ layer from above same, the transmittance $tn$, and the reflectance $rn$ respectively. Because this is initially not the lowest layer, step S34 yields NO. In addition, because the electron intensity $P'n$ reaching the $n^{th}$ layer from below same is not determined, the electron intensity $Pn-1'$ reaching the interface with the $(n-1)^{th}$ layer from the $n^{th}$ layer cannot be determined. Therefore, step S36 yields NO and the backscattering intensity generation subroutine step S22 is executed for $(n+1)^{th}$ layer. This constitutes the recursive processing.

Each time each subroutine step S22 is initiated, the layer number n is incremented (S30). Further, when the lowest layer (n=N+1) is reached, the electron intensity $P'_N = r_{N+1} * P_N$, which corresponds with the reflectance $r_{N+1}$ of the $(N+1)^{th}$ silicon bulk is determined (S40) and the subroutine returns, at which point a return is made to the step S42 of subroutine via which this subroutine is called. The electron intensity $P_{N-1}' = t_N * P_N' + r_N * P_{N-1}$ returning to the interface between the $N^{th}$ layer and the $(N-1)^{th}$ layer is determined by means of this step S42, whereupon the subroutine returns. Therefore, in the subroutine for the $n^{th}$ layer, the electron intensity $Pn-1'=tn*Pn'+rn*Pn-1$ returning to the interface between the $n^{th}$ layer and the $(n-1)^{th}$ layer is determined. The backscattering intensity $P_0'=r1*P_0+t1*P_1'$ returning to the resist layer is ultimately determined when all the subroutines are returned.

[Application Example of the Backscattering Intensity Generation Method of this Embodiment]

Figure 13:
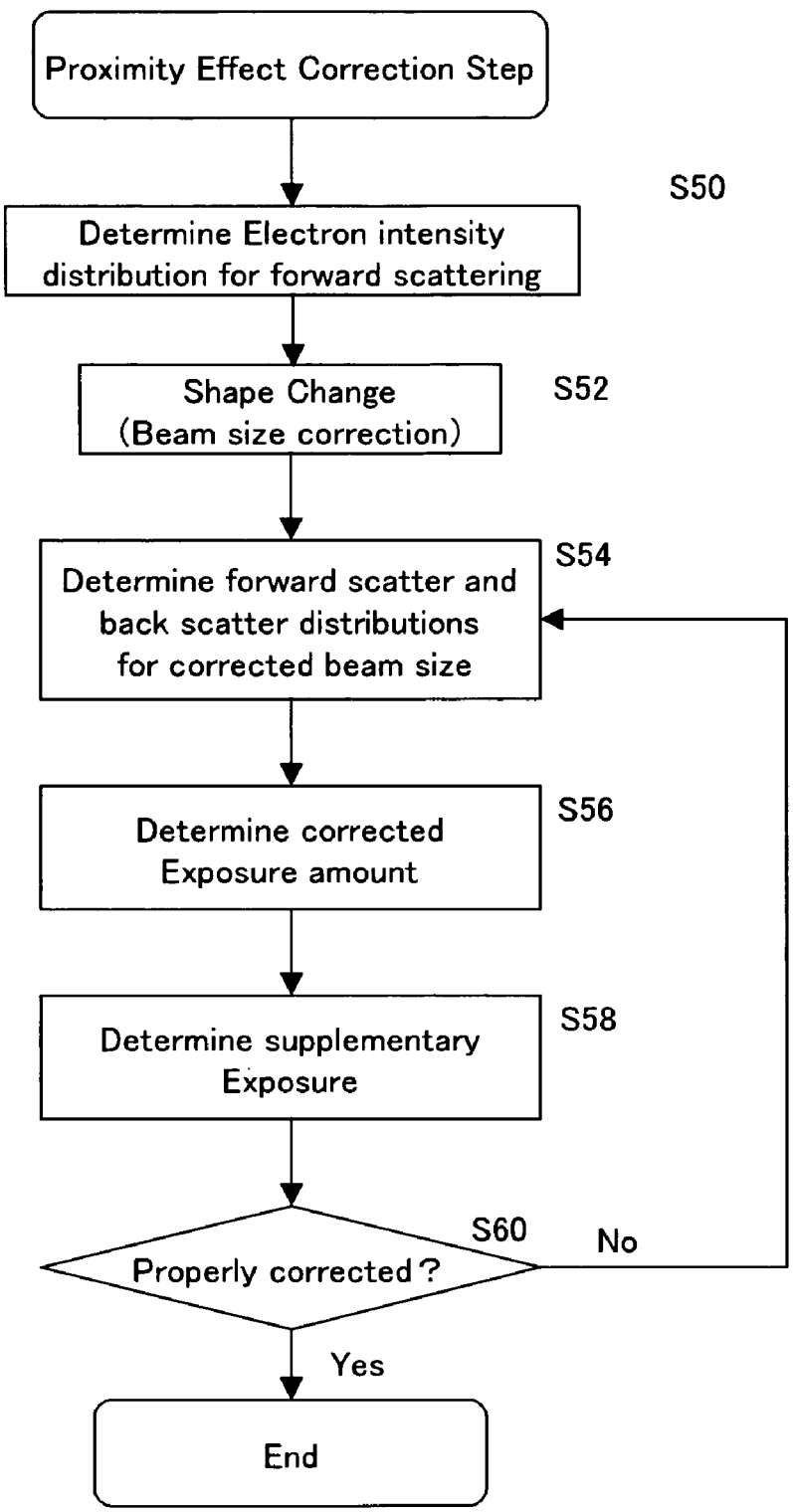
FIG. 13 is a flowchart for proximity effect correction to which the backscattering intensity generation method of this embodiment is applied.

FIG. 13 is a flowchart for proximity effect correction to which the backscattering intensity generation method of this embodiment is applied. This proximity effect correction is disclosed in the above-mentioned Japanese Laid Open Patent Publication No. 2001-52999 (published on Feb. 23, 2001) and the corresponding American Patent (unregistered) and incorporated in this specification by way of reference herein. The proximity effect correction disclosed in Japanese Laid Open Patent Publication No. 2001-52999 (published on Feb. 23, 2001) and the corresponding American Patent (unregistered) is applied to variable shaped beam exposure, and comprises a step in which the pattern size of the exposure is changed on the basis of a forward scatter distribution, the exposure amount of each beam shot is corrected on the basis of a forward and backward scatter distribution, and supplementary exposure is added.

In this application example, the electron intensity distribution for forward scattering is first determined (S50). This distribution is determined by the forward scattering term of Equation (1) above. Because, according to the forward scatter distribution, electrons spread transversely, the half width of the forward scatter distribution (distribution margin at 50% of the maximum intensity) is broader than the exposure pattern width, for example. Accordingly, a shape change to reduce the exposure pattern width is performed (S52) so that the half width of the forward scatter distribution attains the design value width, for example. More specifically, correction to reduce the size of the exposure beam in accordance with the forward scatter distribution is performed.

Figure 14A:
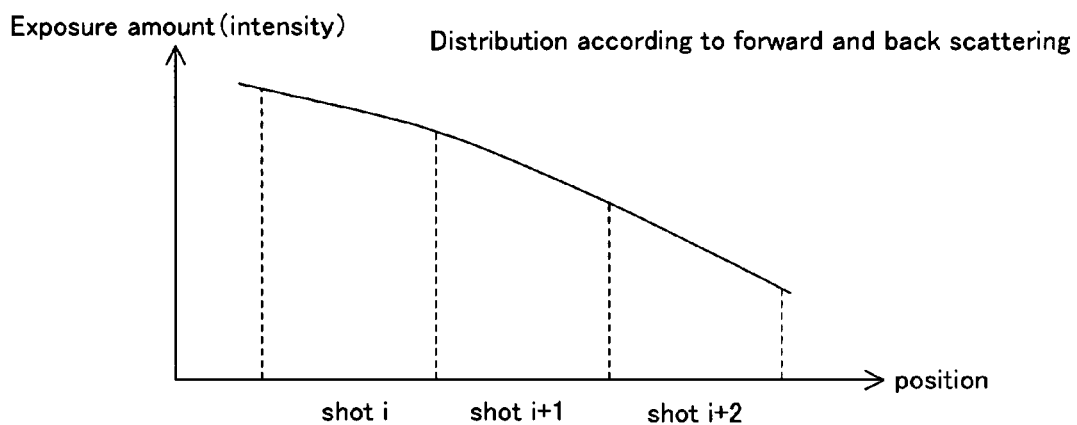
FIG. 14 shows electron intensity distributions that illustrate the proximity effect correction to which the backscattering intensity generation method of this embodiment is applied.
Figure 14B:
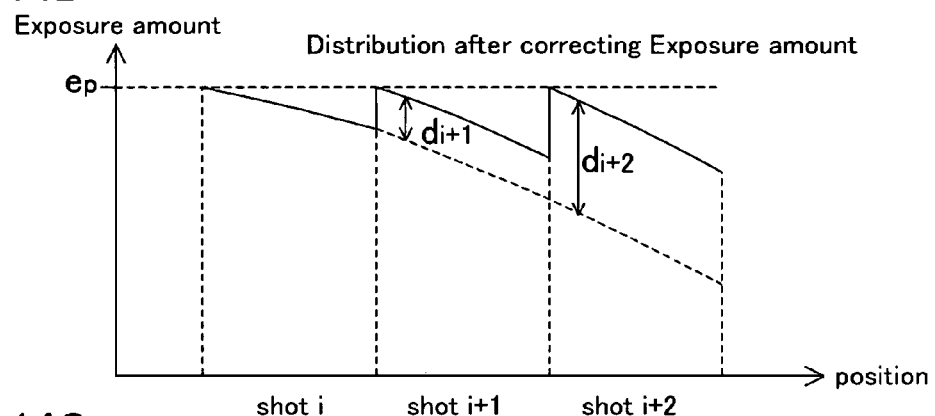

Next, forward scatter and backward scatter distributions are determined for the corrected beam size (S54). This computation is carried out with respect to the forward scattering intensity based on the forward scattering term of Equation (1) above. The backscattering intensity is calculated by using the technique of the present invention. FIG. 14A shows an example of the exposure intensity (electron intensity) distribution prior to an exposure amount correction. In this example, the intensity gradually decreases in shot areas i, i+1, and i+2. The principle cause of this decrease is the influence of the backscattering intensity from the surrounding area, which is dependent on the density of the pattern surrounding the shot area. Accordingly, as shown in FIG. 14B, the correction values di+1 and di+2 are added in the shot areas i+1 and i+2 respectively so that the amount of exposure of each shot area equals the appropriate value ep. That is, the exposure amount of each beam shot is corrected. The exposure amount to which the correction value is applied is the corrected exposure amount (S56). As a result, the exposure amount or exposure intensity of each shot area is substantially the same, as shown in FIG. 14B.

Figure 14C:
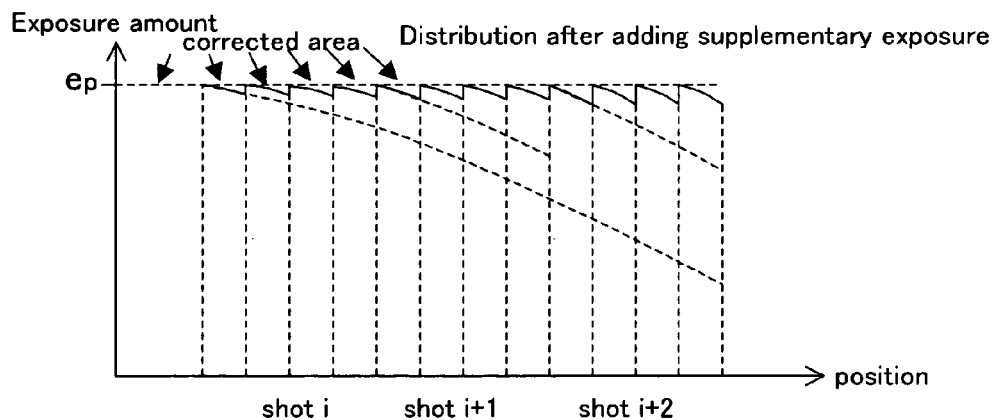

However, because, even in each corrected shot, a difference is produced in the exposure intensity that is dependent on the surrounding pattern density, an electron beam shot of a minute exposure amount is added as supplementary exposure in addition to the electron beam, shot corresponding with the exposure pattern (S58). As a result, as shown in FIG. 14C, the exposure intensity is corrected to a fixed value also within corrected areas.

It is necessary to reexamine the exposure amount correction and supplementary exposure by considering the change to the backscattering that results from the addition of the exposure amount correction and supplementary exposure. Accordingly, steps S54, S56, and S58 are repeated until suitable correction has been confirmed. The exposure intensity is optimized by repeating these steps a number of times.

In the proximity effect correction step described above, the electron intensity (exposure intensity) of backscattering must be determined by means of step S54. The step of generating the backscattering electron intensity of this embodiment is executed by means of step S54.

Figure 15:
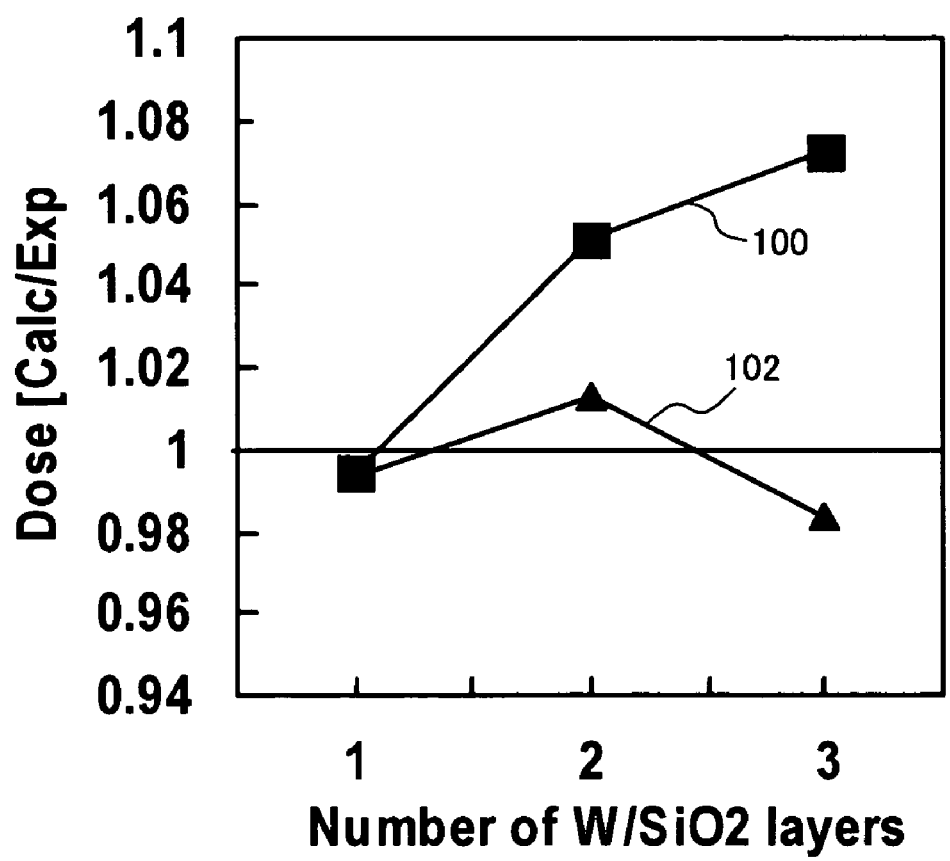
FIG. 15 shows the effect of this embodiment.

FIG. 15 shows the effects of this embodiment. In this experiment, a corrected exposure amount 100, which is determined by introducing only one contact hole layer below the Al layer by means of a conventional procedure, and a corrected exposure amount 102 which is determined by considering all the contact holes below the Al layer according to this embodiment are shown for examples in which W/SiO$_2$ contact holes are formed in only one layer, two layers, and three layers respectively below the Al layer to be exposed. The horizontal axis represents the number of contact hole layers, while the vertical axis indicates the proportion of the exposure amount supplied by the correction calculation when the optimum exposure amount determined via experimentation is 1. Furthermore, this experiment is the outcome of a case where a line and space pattern with a line width of 240 nm and a pitch of 540 nm is exposed after the W/SiO$_2$ layer is formed in one layer, two layers and three layers respectively. The W surface area density for all three layers is 16.2%, while the thickness is 0.75 um.

The exposure amount 100 determined by the conventional method undergoes a shift from the optimum exposure amount 1 as the number of contact hole layers increases. On the other hand, the exposure amount 102 determined by this embodiment substantially matches the optimum exposure amount 1 even when the number of contact hole layers increases.

The backscattering electron intensity generation method of this embodiment can also be applied to the proximity effect correction of the above-mentioned Japanese Laid Open Patent Publication No. 2002-313693 (Oct. 25, 2002) and the corresponding American publication No. 2002-0177056 (published on Nov. 28, 2002). The proximity effect correction of this publication relates to a projection-type exposure method in which a large area undergoes a batch transfer, and is characterized in that the exposure intensity of the design measurement position is made equal over the whole pattern by considering the forward scatter distribution and the backward scatter distribution, and correcting the mask pattern width for the batch transfer. More specifically, supposing that the design width (intended width) is $W_0$ and the exposure intensity of the pattern constituting a reference is $\epsilon_0$, the corrected pattern width W can be determined by resolving the following equation.

$$\frac{1}{2}\left\{erf\left(\frac{W-W_0}{2\beta_f}\right)+erf\left(\frac{W+W_0}{2\beta_f}\right)\right\}+p'_{0i,j}=\varepsilon_0 \quad (26)$$

The second term of this equation is the backscattering electron intensity and the backscattering electron intensity is determined by means of the method of this embodiment. After this equation has been applied to the actual pattern and the corrected data has been created, the mask substrate is exposed by a mask rendering electron beam exposure device. Thereafter, a mask with a corrected pattern width is generated through development and patterning. Then a batch transfer is executed by irradiating the electron beam onto a semiconductor wafer via this mask.

[Modified Example]

In the embodiment above, the area density method is applied by utilizing correction areas of equal size in all the layers of the multi-layered structure. However, while electrons are repeatedly scattered, the distribution thereof is gently sloping and the change in the distribution is gradual. Accordingly, in the case of this modified example, the area density method is applied by using correction areas that increase in size moving downward through the layers. As a result, the computer computation time can be shortened. That is, the correction areas in the lower layers farther from the resist layer are larger in size than the correction areas of the upper layers close to the resist layer. As a result, the computation time can be shortened while preserving high computational accuracy.

In addition, in the above embodiment, the film thickness of the first and third Al wiring layers and that of the second and fourth contact hole layers are equal, and hence the same parameters r, t, and σ are used. However, when any film thickness is thicker (thinner), the reflectance r is larger (smaller); the transmittance t is smaller (larger) and the diffusion length σ is longer (shorter). Therefore, if the parameters when the film thickness is T are r, t, and σ, for example, the parameters of the film thickness 2T are r'=r (1+t$^2$), t'=t$^2$, and:

$$\sigma'=\sqrt{2\sigma^2} \quad (27)$$

When there is a slight shift in the ideal values and actual values, the correct backscattering intensity can be determined by using the parameter values determined experimentally.

In addition, although the lowest layer is a silicon substrate in the above embodiment, it may be possible that the transmission scatter and reflection scatter of electrons up to a predetermined number of layers in a multi-layered structure is considered and only the reflection scatter is applied in the lowest layer of the predetermined number of layers.

Furthermore, although the same parameters were used in the above embodiment for the different W/SiO$_2$ layers 12 and 16, different parameters may be employed for each layer even though the thickness of these layers is completely the same. Different transmission coefficients tn may also be used for upwardly transmitted electrons and downwardly transmitted electrons.

Although, in the above embodiment, a description was provided for a case where the resist layer 14 is formed on the Al layer 13 and the resist layer 14 then undergoes electron beam exposure, the present invention may also be applied to the following case irrespective of the above embodiment.

For example, this case is one in which an $SiO_2$ film is formed on the $Al/Si_2$ layer 15; the resist layer is formed on the $SiO_2$ film; the resist layer is exposed by electron beam exposure; the $SiO_2$ layer is dry etched by using a resist pattern formed by development and so forth contact holes for embedding the W are formed; and then a $W/SiO_2$ layer 15 is formed by forming a W layer over the whole surface and forming W plugs by a damascene process.

In other words, it goes without saying that the present invention can also be applied to a case where the backscattering intensity that is affected by a wiring layer below an insulation film is determined when the resist layer formed on the insulation film is exposed, this being a case where contact holes and wiring grooves and so forth are formed in a $SiO_2$ film or other insulation film and a conductive film of W or copper or similar is embedded in the contact holes and wiring grooves and so forth.

In the generation of the exposure data used in the exposure method of a semiconductor device fabrication method, the invention above can be utilized in the step of accurately determining the charged particle backscattering intensity in the resist layer by considering the plurality of layers below the resist layer.

[Second Embodiment]

According to the procedure for calculating the influence of backscattering in the first embodiment above, the electron number flow within the layers is calculated by defining the reflection coefficient, transmission coefficient, and scatter distribution of each constituent material in each layer and applying a weighting for the area density (occupancy) at which each material is present. That is, as shown in FIG. 10, the flow of the electron number P is combined layer by layer and calculated recursively from the uppermost layer to the lowermost layer. Further, the electron number P0' that ultimately returns to the resist is the energy due to backscattering that is absorbed by the resist. According to this method, because the electron reflection, transmission and screening effects, and so forth, of each material of each layer are implemented, the backscattering intensity can be calculated accurately.

Figure 16:
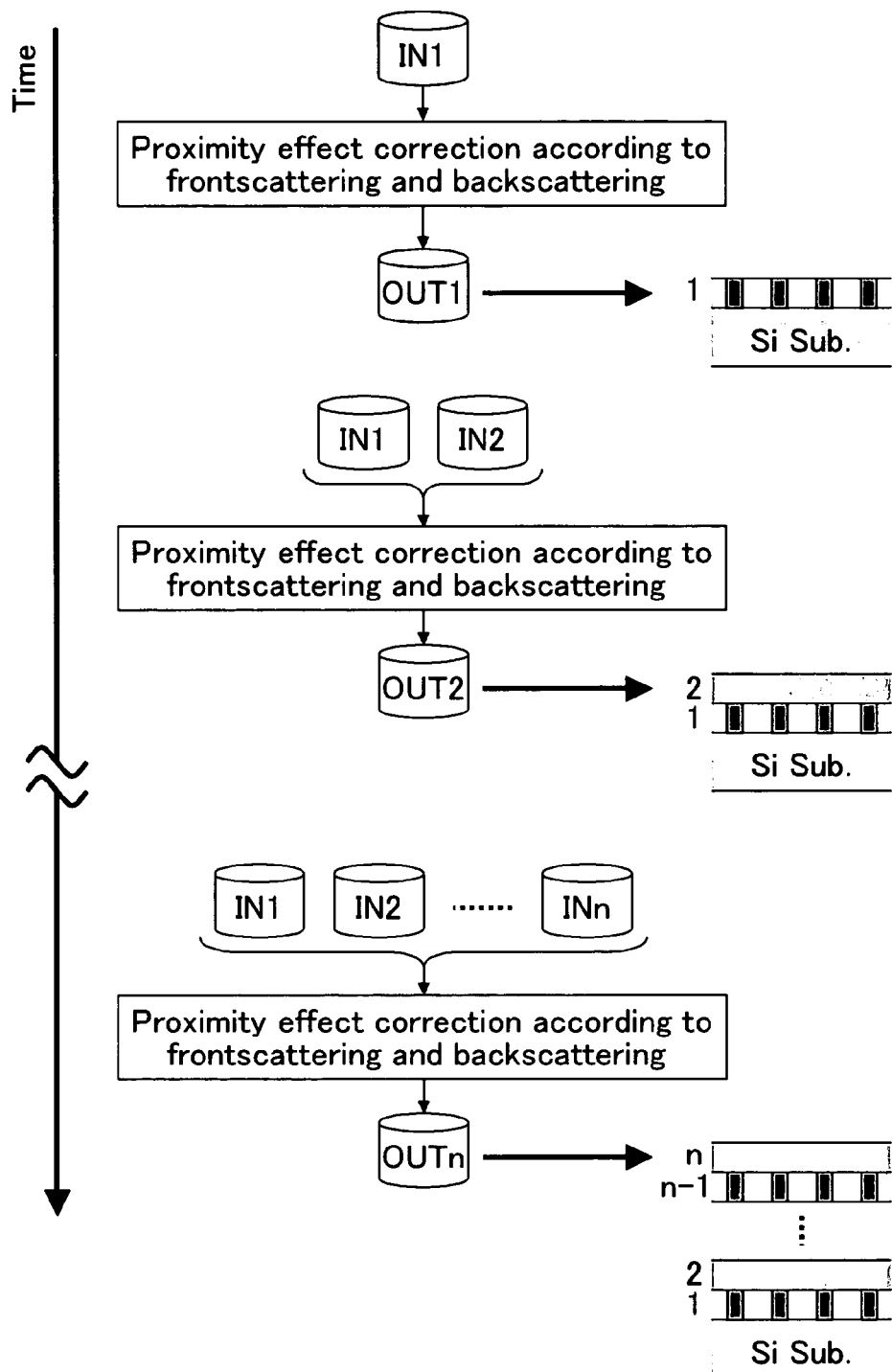
FIG. 16 illustrates the procedure for generating the exposure data for each layer according to the first embodiment.

FIG. 16 illustrates the procedure for generating exposure data for each layer according to the first embodiment. In this figure, the layer numbers are 1, 2, . . . n moving from the silicon substrate side to the uppermost layer, which is the reverse of FIG. 10. In order to perform proximity effect correction on the first layer directly above the silicon substrate, the area density $\alpha$ of the substance within an area based on design data IN1, which is pattern data at design stage for the first layer, is determined, and the backscattering intensity is determined from the reflection coefficient r, the transmission coefficient t, and the scatter distribution coefficient a, and so forth. Correction, which takes into account the proximity effect due to the influence of the backscattering intensity, is then performed on the design data. As a result of the proximity effect correction, exposure data OUT1 for the first layer is determined.

Next, in order to determine exposure data OUT2 for the second layer, the area density of the substances within an area of each layer is determined based on the design data IN2 and IN1 for the second and first layers respectively, and the backscattering intensity with respect to the second layer is determined by recursive processing by means of the reflection coefficient, transmission coefficient, scatter distribution, and so forth, of each layer, whereby proximity effect correction is performed.

Similarly, in order to determine the exposure data OUTn of the nth layer, the design data IN1 to $IN_n$ of the first to nth layers respectively are used and the backscattering intensity with respect to the nth layer is determined by recursive processing, whereby proximity effect correction is performed and exposure data OUTn is determined.

Therefore, according to the first embodiment, in order to determine the backscattering intensity of the nth layer, the flow of electrons (charged particles) must be sequentially calculated with respect to all the lower layers exerting an influence, and there is therefore the problem that a longer period is required for the proximity effect correction processing in the higher layers of a multilayered structure. In addition, in accordance with recursive processing such as processing that starts from the uppermost layer and returns to the uppermost layer once again upon arriving at the lowermost layer, all the lower-layer data must remain, and there is the problem that the amount of data retained in recursive processing increases in higher layers.

Therefore, according to the second embodiment, proximity effect correction can be executed by determining the backscattering intensity sequentially starting with the lower layers, without the need for the recursive processing of the first embodiment.

Figure 17:
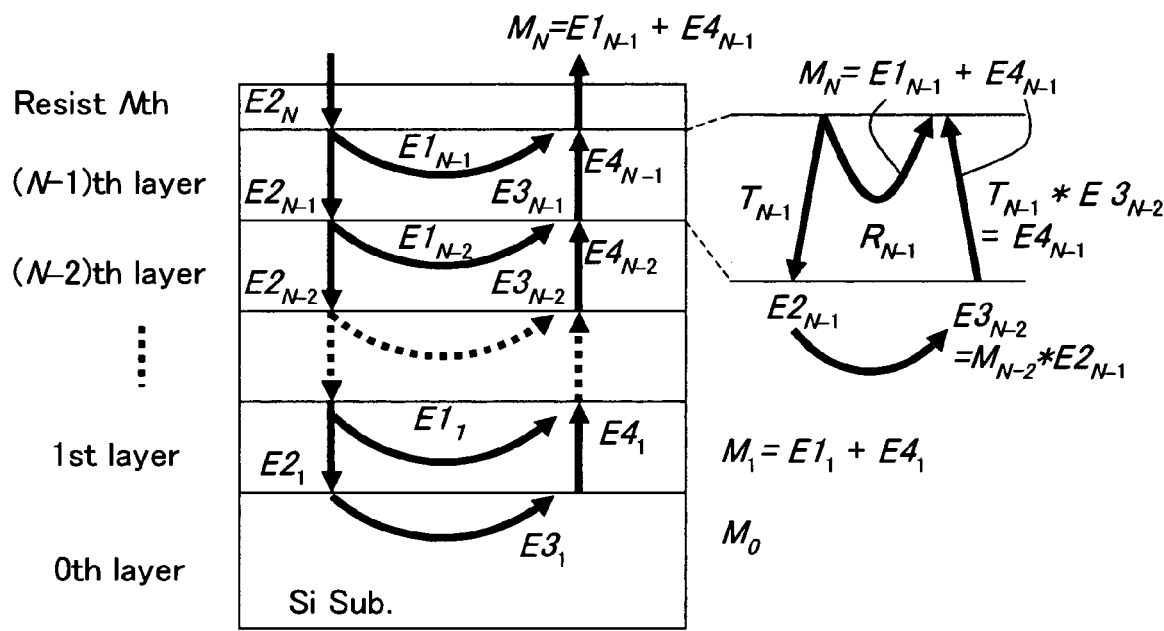
FIG. 17 illustrates the principles of the second embodiment.
Figure 18:
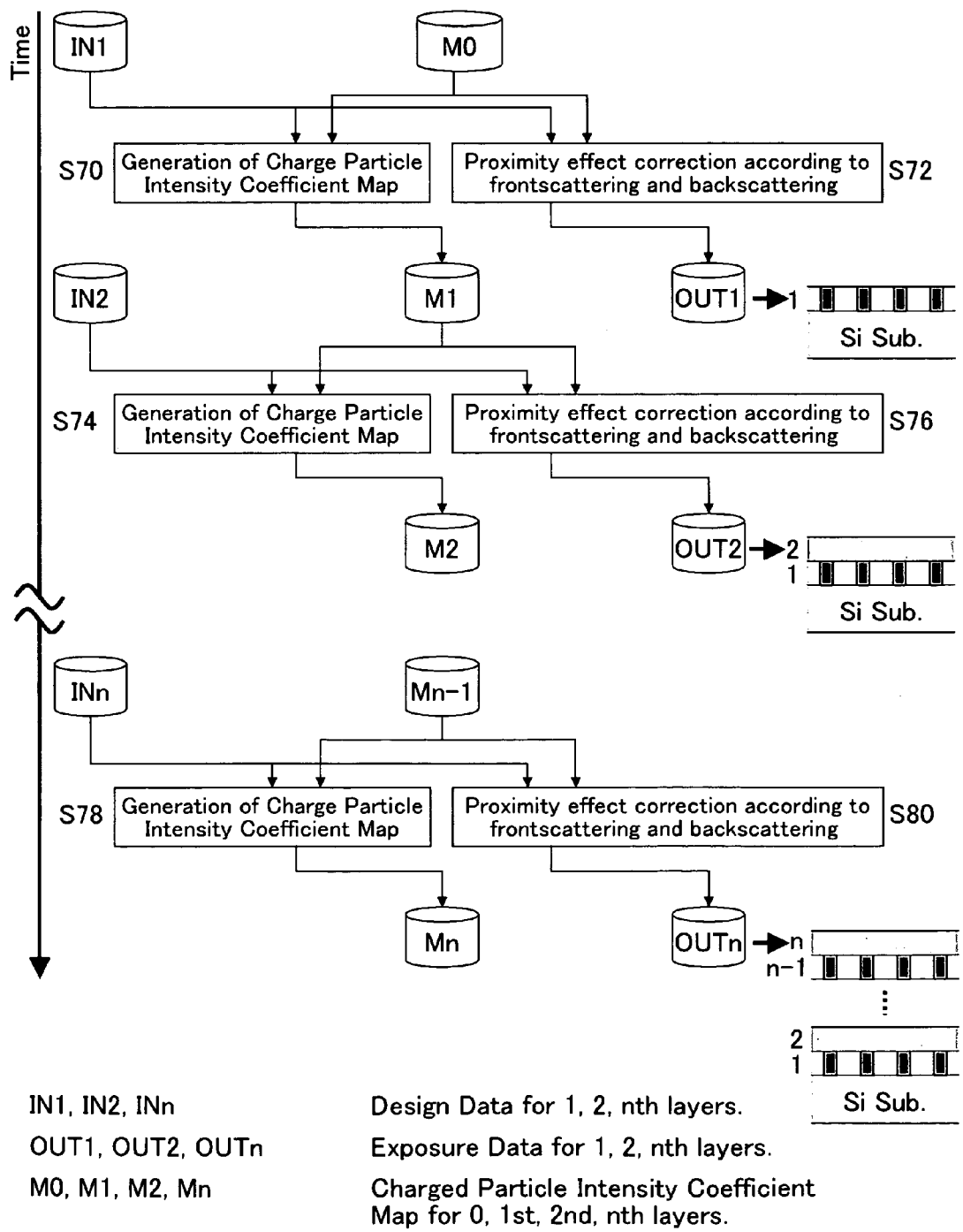
FIG. 18 is a flowchart for the procedure for generating the exposure data according to the second embodiment.

FIG. 17 illustrates the principles of the second embodiment, and FIG. 18 is a flowchart for the procedure for generating exposure data according to the second embodiment. As shown in FIG. 17, the silicon substrate is defined as layer 0, and the layers thereabove are defined as the 1st, 2nd to (N-1)th, and Nth layers. Further, charged particle intensity coefficient maps $M_0$ to $M_{n-1}$ for each layer are determined moving up through the layers in order from the 1st layer. For the nth layer, the backscattering intensity is determined from the charged particle intensity coefficient map $M_{n-1}$ for the (n-1)th layer and the design data $IN_n$ for the nth layer, and proximity effect correction is performed based on the backscattering intensity. The charged particle intensity coefficient map $M_n$ is coefficient data that represents the proportion of charged particles entering at an optional position (i1, j1) in the nth layer to charged particles returning to a position (i2, j2) within a range that includes position (i1, j1) that are reflected within the nth layer, and that are reflected and returned by the layers below the (n-1)th layer after being transmitted by the nth layer. That is, the charged particle intensity coefficient map $M_n$ corresponds to the distance coefficient a shown in FIG. 3 and so forth of the first embodiment. However, because the charged particle intensity coefficient map $M_n$ represents the proportion of charged particles entering at a certain position (i1, j1) to charged particles returning to another position (i2 , j2), the charged particle intensity coefficient map Mn is a coefficient that is dependent on the entry position and backscattering position, whereas the distance coefficient a is simply dependent on the distance without being dependent on position. The two coefficients are different in this respect.

According to the first embodiment, the flow of charged particles in each layer is calculated based on the charged particle intensity (or number of charged particles) corresponding to the amount of exposure irradiated onto the uppermost layer. Hence, it is determined, while performing surface integration, how the charged particle intensity is distributed, as a result of the distribution of the charged particle intensity entering each layer, which is caused by scattering. On the other hand, according to the second embodiment, a coefficient indicating in what proportion charged particles entering an optional position (i1, j1) in each layer are backscattered to positions (i2, j2) in this range is determined as a charged particle intensity coefficient map. The charged particle intensity coefficient map $M_n$ can be determined, independently of the irradiated exposure amount, from the pattern data (design data $IN_n$) of the material of the nth layer and the charged particle intensity coefficient map $M_{n-1}$ of the layer immediately below the nth layer. Further, when the charged particle intensity coefficient map $M_{n-1}$ of the layer immediately below the nth layer is determined, the backscattering intensity of the nth layer can be determined from the charged particle intensity P entering the nth layer, the pattern area density α of the nth layer and the charged particle intensity coefficient map $M_{n-1}$ of the (n−1)th layer.

Therefore, as shown in FIG. 18, it is preferable that the exposure data OUT is determined by means of proximity effect correction steps S72, S76, and S80 in sequence starting from the lower layer of the integrated circuit and the charged particle intensity coefficient maps $M_1$ to $M_n$ for each layer are determined at the same time (S70, S74, S78). That is, when the exposure data OUT of the nth layer is determined by means of proximity effect correction, the backscattering intensity with respect to the nth layer can be determined by means of the nth layer design data $IN_n$ and the charged particle intensity coefficient map $M_{n-1}$ for the (n−1)th layer immediately below the nth layer, there being no need to perform recursive processing as the first embodiment.

Figure 19A:
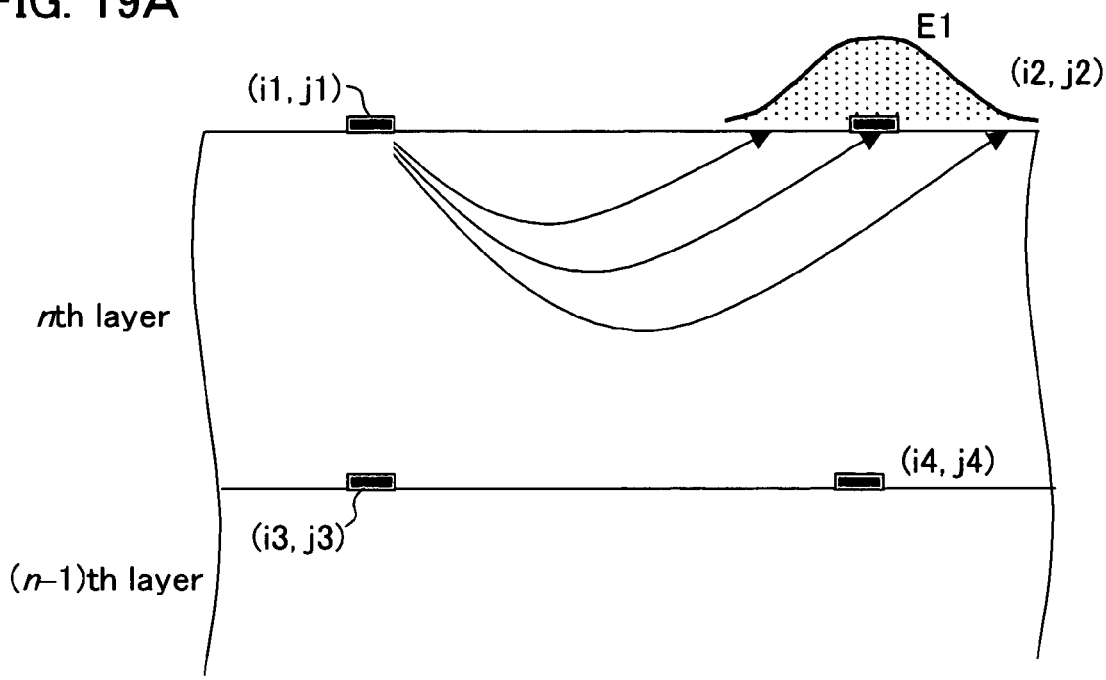
FIG. 19 serves to illustrate the principles of the charged particle intensity coefficient map Mn.

FIG. 19 serves to illustrate the principles of the charged particle intensity coefficient map $M_n$. Here, the charged particle intensity coefficient at which the charged particles entering at an optional position (i1, j1) exert an influence on position (ij, j2) in a range that includes position (i1, j1) is determined. First, as shown in FIG. 19A, the charged particles entering at an optional position (i1, j1) in the nth layer reach position (i2, j2) after being reflected within the nth layer. Because scattering takes place within the nth layer, positions (i2, j2) have the distribution E1. This distribution is a Gaussian distribution, for example.

Figure 19B:
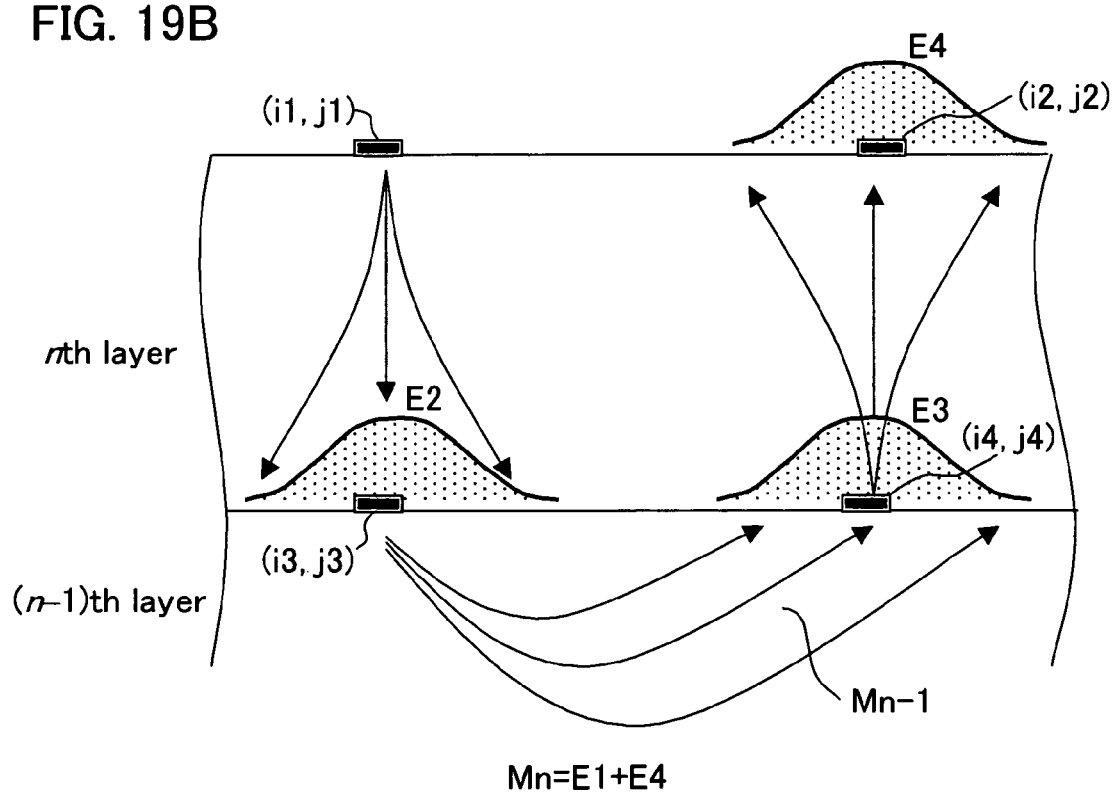

Next, as shown in FIG. 19B, the charged particles entering at position (i1, j1) are transmitted while being scattered within the nth layer and reach position (i3, j3) at the interface with the (n−1)th layer. In this case also, spreading takes place with the distribution E2 in position (i3, j3). This distribution E2 can be determined from the transmission coefficient T, the area density α of the nth layer material, and the distance coefficient A representing the distribution. Furthermore, the charged particles reaching position (i3, j3) are reflected while being scattered in the lower layers below the (n−1)th layer and reach the interface position (i4, j4) with a distribution E3. The proportion of charged particles reaching the interface position is indicated by the charged particle intensity coefficient map $M_{n-1}$ of the (n−1)th layer. Therefore, distribution E3 can be determined from $E3=M_{n-1}*E2$. However, E2 possesses a distribution and, hence, in order to determine the distribution E3, a surface integration must be performed for the distribution E2. Further, the charged particles reaching position (i4, j4) are transmitted while being scattered within the nth layer, and reach position (i2, j2) with the spreading of distribution E4. This distribution E4 can be determined by means of the transmission coefficient T, the area density α of the material of the nth layer, and the distance coefficient A that represents the distribution. The surface integration must also be performed for the distribution E3.

The charged particle intensity map $M_n$ representing the influence that the charged particles reaching position (i1, j1) of the nth layer exert on position (i2, j2) is the sum of distributions E1 and E4. Further, the charged particle intensity coefficient map $M_n$ includes the charged particle intensity coefficient for all positions (i2, j2) around the position (i1, j1), to all positions (i1, j1) of the nth layer.

Figure 20:
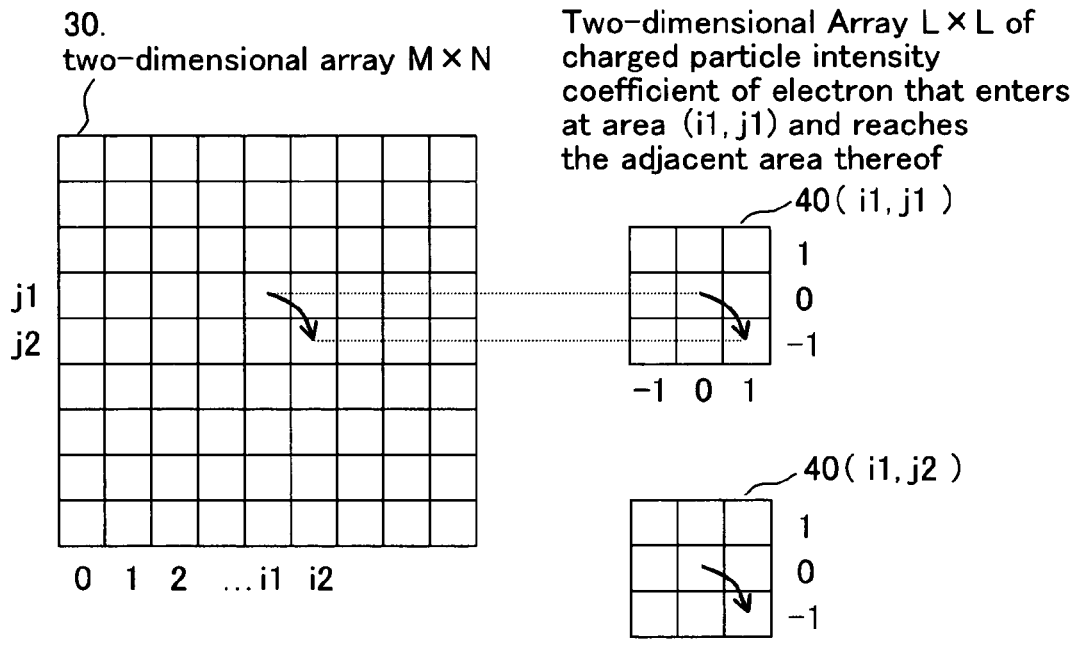
FIG. 20 shows the constitution of the charged particle intensity coefficient map.
Figure 21:
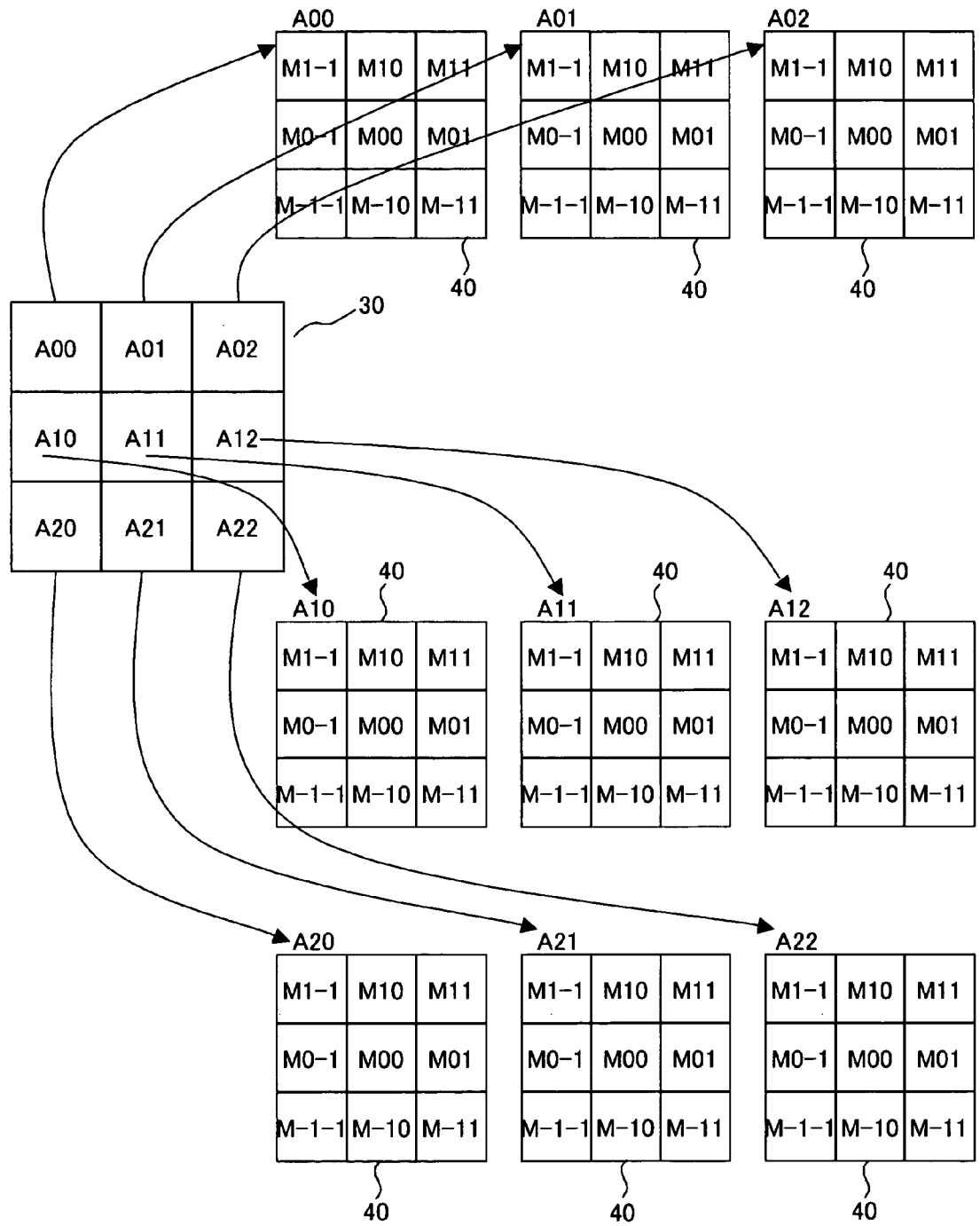
FIG. 21 shows the constitution of the charged particle intensity coefficient map.

FIGS. 20 and 21 show the constitution of a charged particle intensity coefficient map. A charged particle intensity coefficient map is constituted by using a plurality of divided areas. That is, the charged particle intensity coefficient map is a data structure that has, as elements, the charged particle intensity coefficients for charged particles that enter an optional area (position) (i1, j1) and reach an adjacent area (i2, j2). As shown in FIG. 20, this data structure is constituted by a table 30 consisting of a two-dimensional array of M×N areas, and an L×L two-dimensional array table 40 provided in correspondence with each area of table 30. For example, the charged particle intensity coefficients for charged particles that enter an optional area (i1, j1) and reach adjacent L×L areas (i2-i1, j2-j1) constitute the elements of table 40. Here, the areas (i2-i1, j2-j1) of table 40 correspond to areas in a range in which area (i1, j1) is the center (0,0), and are each specified by local coordinates (i2-i1, j2-j1). Further, the table 40 corresponds to respective areas of table 30 and elements of table 30 are reference numbers (indexes) to table 40.

FIG. 21 shows a more specific data structure. Reference numbers A00 to A22 are stored as the respective elements of table 30, which consists of a 3×3 two-dimensional array. Further, the charged particle intensity coefficients M-1-1 to M00 to M11 are stored as the respective elements of the table 40 referenced by reference number A00. Table 30 consists of nine areas and therefore table 40 is also constituted by nine areas. However, in cases where the pattern structure is the same, the charged particle intensity coefficient of the corresponding table 40 is sometimes also the same. In such cases, the elements of table can reference the same table 40, whereby the data amount can be reduced.

Therefore, the charged particle intensity coefficient map according to this embodiment is constituted by the two types of table shown below.

(1) The first type is the L×L two-dimensional array table 40 at whose center is a certain area (i1, j1), and which holds, as data, the charged particle intensity coefficients of the charged particles that reach an adjacent optional counterpart area (i2-i1, j2-j1). Here, L represents the number of areas that can be arranged within the region, whose center is area (i1, j1), reached by the charged particles that enter at the area (i1, j1).

(2) The second type is the M×N two-dimensional array table 30 that holds reference data to corresponding two-dimensional arrays 40. M and N are the numbers of the areas in the horizontal and vertical directions respectively in the integrated circuit chip region.

Therefore, in cases where the distribution E3 of the nth layer is determined by using the charged particle intensity coefficient map $M_{n-1}$, the charged particle intensity coefficients of electrons entering area (i1, j1) and, reaching area (i2, j2) are obtained by referencing the elements corresponding to area (i1, j1) in table 30 and extracting elements corresponding to a counterpart area (i2-i1, j2-j1) in table 40 referenced from the area (i1, j1) elements. Further, if the structure of the range of a plurality of areas is the same, the tables 40 for these areas are also the same. Therefore, the same table 40 can be referenced from different areas (i1, j1), and, in this case, the amount of data can be reduced.

Figure 22:
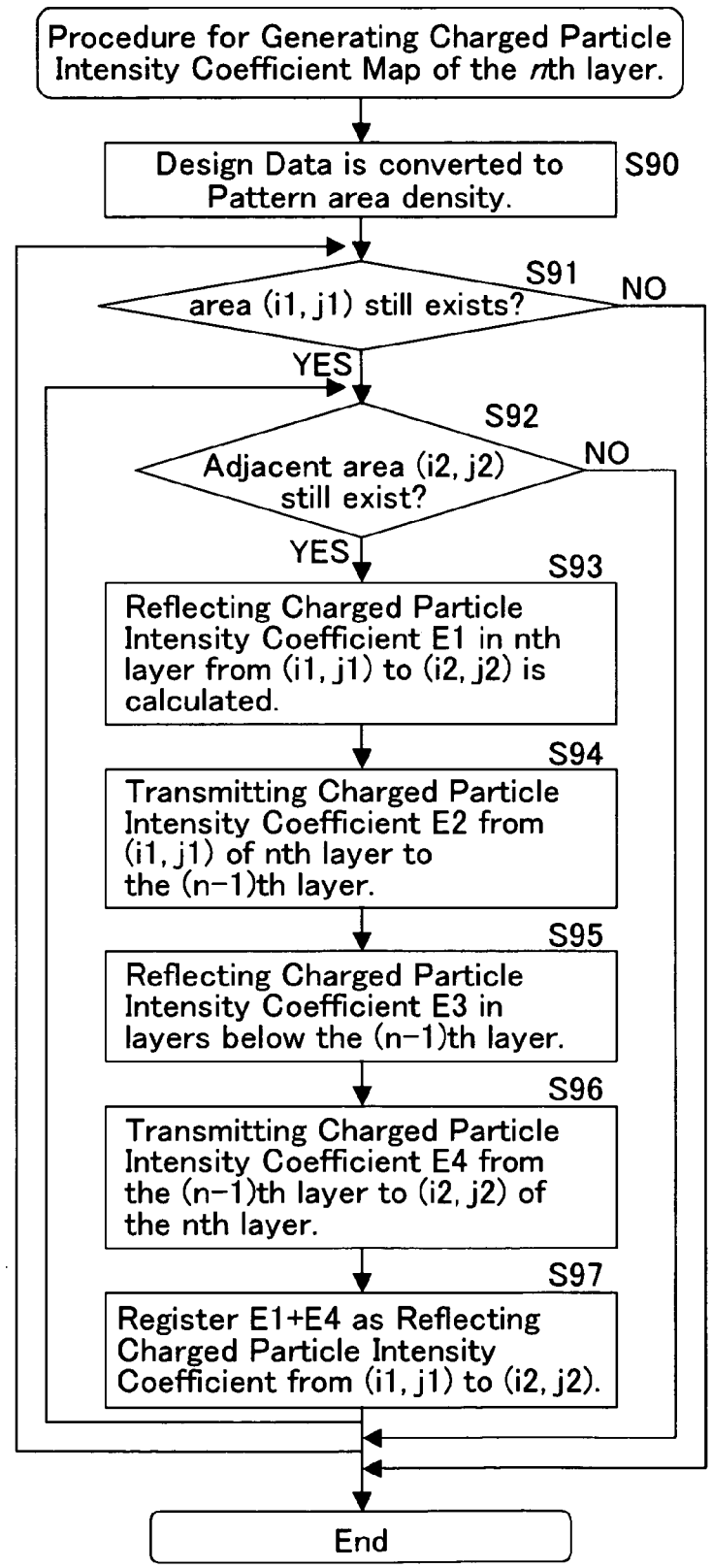
FIG. 22 is a flowchart that shows the procedure for generating the charged particle intensity coefficient map $M_n$.

FIG. 22 is a flowchart showing the procedure for generating the charged particle intensity coefficient map $M_n$ of the nth layer from the nth layer design data and the charged particle intensity coefficient map $M_{n-1}$ of the (n−1)th layer.

The method for generating the charged particle intensity coefficient map will be described in detail while referring to FIG. 19.

First, as pre-processing, with respect to the design data $IN_n$ of the nth layer, the region in which the pattern is present is partitioned in the form of a mesh, the pattern area density of each partitioned area is calculated to generate a pattern area density map α (S90). At this time, even though the hole pattern of the contact hole layer is a rectangle based on the design data, in reality, the corners of the rectangle shape are removed to become a circle. Therefore, the pattern of the design data is desirably resized or a processing that applies a ratio to the pattern area density is desirably implemented so that the pattern area density approaches the actual pattern area density.

In addition, the ratio $T_k$ (transmission coefficient) by which electrons entering the nth layer are transmitted by a layer, the ratio $R_k$ (reflection coefficient) by which electrons are reflected within the layer, and the scatter distribution within the layer (scatter length: $\sigma_k$) are defined for each material contained in the nth layer. Here, k is the name of each material, and the reflection coefficient $R_k$ and transmission coefficient $T_k$ are the same as the reflection coefficient r and transmission coefficient t of the first embodiment. For example, when the nth layer is formed by W and $SiO_2$, the transmission coefficient, reflection coefficient, and scatter length of each material are $T_w$, $R_w$, $\sigma_w$, $T_{SiO2}$, $R_{SiO2}$, and $\sigma_{SiO2}$. Further, the scatter distribution is assumed to be a Gaussian distribution. Hereinafter, for the purpose of simplifying the description, a case where the substrate is formed from Si and the 1st to nth layers are formed from W and $SiO_2$ will be considered.

Next, area (i1, j1) is fixed and the charged particle intensity coefficient according to which the charged particles (electrons, for example) entering this area affect an adjoining area is determined. As illustrated by means of FIG. 19, the charged particle intensity coefficient reaching the adjacent area (i2, j2) is the sum of the charged particle intensity coefficients calculated via the routes of the following two paths:

(1) E1: the route via which charged particles entering area (i1, j1) are reflected within the nth layer and reach area (i2, j2) (FIG. 19A).

(2) E2, E3, E4: the route via which charged particles entering area (i1, j1) are transmitted by the nth layer, reflected by the layers below the (n−1)th layer, and are transmitted by the nth layer before reaching area (i2, j2) (FIG. 19B).

Route (1) above is determined by means of the following equation that employs the reflection coefficient R of each material and adds a weighting by means of the area density α of each material (S93).

$$E1_{i2,j2} = \alpha_{W,i1,j1} R_W A_{W,i2-i1,j2-j1} + (1-\alpha_{W,i1,j1}) R_{SiO2} A_{SiO2,i2-i1,j2-j1} \quad (26)$$

Here, $A_{w, i2-i1, j2-j1}$, and $A_{SiO2, i2-i1, j2-j1}$ are the scattering intensity coefficients of W and $SiO_2$ respectively from area (i1, j1) to area (i2, j2) and are the same as the distance coefficient a according to the first embodiment. The scattering intensity coefficients A each have an area suffix (i2-i1, j2-j1) but are, in reality, distance coefficients corresponding to the distance alone. As shown in the equation above (26), the charged particle intensity coefficient E1 of route (1) is determined from the product of the area densities $\alpha_{w, i1, j1}$, $(1-\alpha_{W, i1, j1})$, the reflection coefficients $R_W$, $R_{SiO2}$, and the scattering intensity coefficients $A_{w, i2-i1, j2-j1}$, and $A_{SiO2, i2-i1, j2-j1}$ of each material in area (i1, j1).

Route (2) above may be rendered by linking three routes (E2, E3, and E4). First, the charged particle intensity coefficient E2 of the electrons that are transmitted and scattered in the nth layer from area (i1, j1) and reach area (i3, j3) is, similarly to Equation (26), as follows (S94).

$$E2_{i3,j3} = \alpha_{W,i1,j1} T_W A_{W,i3-i1,j3-j1} + (1-\alpha_{W,i1,j1}) T_{SiO2} A_{SiO2,i3-i1,j3-j1} \quad (27)$$

Here, $A_{W, i3-i1, j3-j1}$, and $A_{SiO2, i3-i1, j3-j1}$ are the scattering intensity coefficients (distance coefficients) of W and $SiO_2$ from area (i1, j1) to area (i3, j3).

Next, the charged particle intensity coefficient E3 of electrons that travel from area (i3, j3) and are reflected and scattered by the layers below the (n−1)th layer before reaching area (i4, j4) may be expressed as follows by using $E2_{i3,j3}$ determined by Equation (27) and the element coefficient $E_{n-1}$ (i3, j3; i4, j4) of the (n−1)th charged particle intensity coefficient map $M_{n-1}$.

$$E_{n-1}(i3,j3;i4,j4) \cdot E2_{i3,j3} \quad (28)$$

As detailed above, the $E_{n-1}$ (i3, j3 i4, j4) is the charged particle intensity coefficient of electrons that enter area (i3, j3) and return to area (i4, j4) in the (n−1)th charged particle intensity coefficient map $M_{n-1}$. Further, E2 possesses a distribution, and therefore, the charged particle intensity coefficient E3 of charged particles that enter area (i1, j1) and reach each area (i4, j4) is determined by accumulating Equation (28) above in areas (i3, j3) with respect to distribution E2. That is, the charged particle intensity coefficient E3 is the cumulative value of Equation (28) with respect to a plurality of areas (i3, j3) in the distribution E2 and may be expressed as follows (S95).

$$E3_{i4,j4} = \sum_{i3}\sum_{j3} [E_{n-1}(i3, j3; i4, j4) \cdot E2_{i3,j3}] \quad (29)$$

Ultimately, the charged particle intensity coefficient of electrons that are transmitted upward from area (i4, j4) through the nth layer and reach area (i2, j2) is rendered as follows similarly to Equation (27) by using $E3_{i4,j4}$ determined in Equation (29).

$$\{\alpha_{W,i4,j4} T_W A_{W,i2-i4,j2-j4} + (1-\alpha_{W,i4,j4}) T_{SiO2} A_{SiO2,i2-i4,j2-j4}\} E3_{i4,j4} \quad (30)$$

Here, $A_{W, i2-i4, j2-j4}$, and $A_{SiO2, i2-i4, j2-j4}$ are the scattering intensity coefficients (distance coefficients) of W and $SiO_2$ from area (i4, j4) to area (i2, j2). Therefore, since E3 is a distribution that includes a plurality of areas (i4,j4), the charged particle intensity coefficient E4 of electrons traveling from area (i1, j1) to area (i2, j2) is the cumulative value of Equation (30) with respect to the peripheral area (i4, j4) of area (i2, j2), and may be expressed as follows (S96).

$$E4_{i2,j2} = \sum_{i4}\sum_{j4}\left[\left\{\begin{array}{l}\alpha_{W,i4,j4} T_W A_{W,i2-i4,j2-j4} + \\ (1-\alpha_{W,i4,j4}) T_{SiO2} A_{SiO2,i2-i4,j2-j4}\end{array}\right\} \cdot E3_{i4,j4}\right] \quad (31)$$

Based on the above equation, the charged particle intensity coefficient $E_n$ of electrons that enter area (i1, j1) and reach area (i2, j2) is rendered as follows as per the sum E1+E4 of Equations (26) and (31) (S97).

$$E_n(i1, j1; i2, j2) = E1_{i2,j2} + E4_{i2,j2} \quad (32)$$

Further, the charged particle intensity coefficient map $M_n$ of the nth layer is generated by determining, by means of Equation (32), the charged particle intensity coefficient $E_n$ with respect to all combinations of all the areas (i1, j1) and neighboring areas (i2, j2). That is, the charged particle intensity coefficients $E_n$ determined by Equation (32) are rendered as the elements (i2-i1, j2-j1) of the L×L tables 40 for all the elements (i1, j1) of the M×N table 30, and constitutes the charged particle intensity coefficient map Mn (S91, S92). The data structure of the charged particle intensity coefficient map $M_n$ is as shown in FIGS. 20 and 21.

The proximity effect correction steps S72, S76, and S80 in FIG. 18 will be described next. In the proximity effect correction step, the backscattering intensity must be determined. A description will be provided for a method of determining the backscattering intensity Fb of the nth layer from the charged particle intensity coefficient map $M_{n-1}$ of the (n−1)th layer and the nth layer design data $IN_n$.

The charged particle intensity map $M_{n-1}$ expresses the proportion of electrons entering a certain area that return to another area (charged particle intensity coefficient). Therefore, the backscattering intensity by which the exposure amount Q irradiated onto the area (i+l, j+m) is supplied to area (i,j) is rendered by the following equation.

$$E_{n-1}(i+l, j+m; i,j) \cdot \alpha_{i+l,j+m} Q_{i+l,j+m} \quad (33)$$

Here, $\alpha_{i+l,j+m}$ is the pattern area density of area (i+l, j+m), and $Q_{i+l,j+m}$ is the exposure amount (charged particle amount, charged particle intensity) irradiated onto the area (i+l, j+m). Therefore, the backscattering intensity $Fb_{i,j}$ supplied to area (i,j) from the peripheral area is rendered as follows by performing surface integration on Equation (33) by means of the surface density method of FIG. 3.

$$Fb_{i,j} = \sum_l \sum_m E_{n-1}(i+l, j+m; i, j) \cdot \alpha_{i+l,j+m} Q_{i+l,j+m} \quad (34)$$

When this equation (34) is compared with Equation (4) in FIG. 3 of the first embodiment, the electron number P of Equation (4) corresponds to the product of the exposure amount Q and the pattern area density α of Equation (34), and the distance coefficient a of Equation (4) corresponds to the charged particle intensity coefficient $E_{n-1}$ of Equation (34).

Further, in the proximity effect correction steps S72, S76, and S80, exposure amount correction, shape modification, or shape modification+exposure amount correction are performed by using the backscattering intensity distribution rendered by Equation (34). The method for proximity effect correction illustrated in Japanese Laid Open Patent Publication No. 2001-52999 (published on Feb. 23, 2001) and the corresponding American patent (U.S. Pat. No. 6,610,989 issued on Aug. 26, 2003) is as described in detail by means of FIG. 13. When shape modification, exposure amount correction and supplementary exposure are added, the backscattering intensity determined by Equation (34) is used. Further, because the method of proximity effect correction illustrated in Japanese Laid Open Patent Publication No. 2002-313693 (published on Oct. 25, 2002) and the corresponding American Laid Open Patent. No. 2002-0177056 (published on Nov. 28, 2002) is for a batch transfer, exposure amount correction and supplementary exposure are not added, correction being performed by shape modification alone. The backscattering intensity determined by means of Equation (34) is also used in this shape modification.

Thereafter, returning now to FIG. 18, the exposure data generation step of an integrated circuit device with a multilayered wiring structure that employs the second embodiment is as follows. By moving upward from the first, layer formed on the silicon substrate, exposure data OUT is generated for each layer by means of proximity effect correction from the design data and the lower-layer charged particle intensity coefficient map, and the charged particle intensity coefficient map for this layer is generated from the design data and the lower-layer charged particle intensity coefficient map.

Initially, the backscattering intensity is determined by means of Equation (34) from the 1st layer design data IN1 and the charged particle intensity coefficient M0 of the silicon substrate, and the exposure data OUT1 is determined by means of proximity effect correction. At the same time, the 1st-layer charged particle intensity coefficient map M1 is determined from the design data IN1 and the charged particle intensity coefficient map M0 by means of Equation (32). Here, an area density map α for each area and material is generated from the design data IN1, and the parameters rendered beforehand (See FIG. 7) are used. Further, where the charged particle intensity coefficient map M0 of the silicon substrate is concerned, the silicon substrate is composed only of silicon material and therefore the tables 40 of all the areas are the same, meaning that the charged particle intensity coefficient is the same as the distance coefficient a irrespective of position. That is, the charged particles transmitted by the first layer are reflected and return to the first layer while being scattered in accordance with the distance coefficient a (scatter distribution parameter) within the silicon substrate. Therefore, by using the distance coefficient a, the charged particle intensity coefficient $E3_1$ (See FIG. 17) can be determined by means of Equation (29).

Next, exposure data OUT2 is determined by means of proximity effect correction (S76) by determining the backscattering intensity from the second-layer design data IN2 and the charged particle intensity coefficient map M1 for the first layer. At the same time, the charged particle intensity coefficient map M2 for the second layer is generated from the design data IN2 and the charged particle intensity coefficient map M1.

By repeating the proximity effect correction and the generation of the charged particle intensity coefficient map, it is possible to generate the exposure data OUT and charged particle intensity coefficient maps M of all the layers. Further, in order to determine the backscattering intensity of the nth layer only, the charged particle intensity coefficient map $M_{n-1}$ for the (n−1)th layer and nth-layer design data are necessary, meaning that there is no need to reference data or the states of the lower layers. Further, there is no need for recursive computation as the first embodiment.

What is claimed is:

1. A method for generating a backscattering intensity with which charged particles are backscattered to a resist layer when a charged particle beam is irradiated onto the resist layer which is formed over a plurality of layers, each of which includes a pattern of one substance or a plurality of substances, wherein, with respect to the $n^{th}$ layer from the resist layer among the plurality of layers, there is provided, for each of the substances contained, in the $n^{th}$ layer, a reflection coefficient (rn), which corresponds with the number of particles reflected by the $n^{th}$ layer among the charged particles transmitted by the $(n-1)^{th}$ layer; a transmission coefficient (tn), which corresponds with the number of particles transmitted by the $n^{th}$ layer among the charged particles reaching the $n^{th}$ layer; and a scatter distribution in which the charged particles are scattered within the $n^{th}$ layer;

the generation method comprising:

a first step of generating the backscattering intensity by using the reflection coefficient (rn), the transmission coefficient (tn), and the scatter distribution.

2. The charged particle backscattering intensity generation method according to claim 1, wherein, in the first step, a charged particle scattering intensity which is main cause of the backscattering intensity is generated by using the reflection coefficient (rn), the transmission coefficient (tn), and the scatter distribution, for each layer of the plurality of layers.

3. The charged particle backscattering intensity generation method according to claim 2, wherein, in the first step, with respect to a predetermined focus area of the $n^{th}$ layer, surface integration is performed on the charged particle scattering intensity from the surrounding area that includes the focus area, in accordance with a surface area density ($\alpha$n) of the substance(s) in the $n^{th}$ layer, and a distance coefficient (an) determined from the scatter distribution and corresponding with the distance between the surrounding area and the focus area.

4. The charged particle backscattering intensity generation method according to claim 3, wherein the charged particle scattering intensity of the first step includes (1) a downwardly transmitted charged particle intensity determined by multiplying the transmission coefficient (tn) by a first charged particle intensity transmitted by the $(n-1)^{th}$ layer, and (2) a third charged particle intensity, which is determined by adding a reflected charged particle intensity determined by multiplying the reflection coefficient (rn) by the first charged particle intensity and an upwardly transmitted charged particle intensity determined by multiplying the transmission coefficient (tn) by a second charged particle intensity returning from the $(n+1)^{th}$ layer.

5. The charged particle backscattering intensity generation method according to claim 4, wherein the first step with respect to the $n^{th}$ layer is performed recursively from the first layer to the lowest layer of the plurality of layers.

6. The charged particle backscattering intensity generation method according to claim 5, wherein the third charged particle intensity determined in the first layer below the resist layer is treated as the backscattering intensity.

7. The charged particle backscattering intensity generation method according to claim 4, wherein, when the first step is executed with respect to the first layer of the plurality of layers, the first charged particle intensity is determined from the charged particle intensity irradiated onto the resist layer in accordance with the exposure pattern density.

8. The charged particle backscattering intensity generation method according to claim 4, wherein, when, in the surface integration of the first step, the $n^{th}$ layer is divided into a plurality of fragmented areas, the first charged particle intensity, the downwardly transmitted charged particle intensity, the reflected charged particle intensity, the upwardly transmitted charged particle intensity, and the third charged particle intensity are determined in each area.

9. The charged particle backscattering intensity generation method according to claim 8, wherein the area size of a lower layer further from the resist layer is larger than the area size of an upper layer close to the resist layer.

10. The charged particle backscattering intensity generation method according to claim 1, wherein the substances contained in each of the layers include at least one of a conductive material, an insulation material, and a semiconductor material, or all these materials.

11. A charged particle backscattering intensity generation program that causes a computer to execute a procedure for generating the backscattering intensity with which charged particles are backscattered to a resist layer when a charged particle beam is irradiated onto the resist layer which is formed over a plurality of layers, each of which includes a pattern of one substance or a plurality of substances, wherein, with respect to the $n^{th}$ layer from the resist layer among the plurality of layers, there is provided, for each of the substances contained in the $n^{th}$ layer, a reflection coefficient (rn), which corresponds with the number of particles reflected by the $n^{th}$ layer among the charged particles transmitted by the $(n-1)^{th}$ layer; a transmission coefficient (tn), which corresponds with the number of particles transmitted by the $n^{th}$ layer among the charged particles reaching the $n^{th}$ layer and a scatter distribution in which the charged particles are scattered within the $n^{th}$ layer; and wherein the generation procedure comprises a procedure for generating the backscattering intensity by using the reflection coefficient (rn), the transmission coefficient (tn), and the scatter distribution.

12. A method for fabricating a semiconductor device having a plurality of layers, each of which includes a pattern of one substance or a plurality of substances, comprising the steps of:

generating backscattering intensity with which charged particles are backscattered to a resist layer when a charged particle beam is irradiated onto the resist layer that is formed over at least one layer of the plurality of layers;

generating corrected exposure data by subjecting exposure data including an exposure pattern to proximity effect correction in accordance with the backscattering intensity; and performing exposure, development and patterning by means of the corrected exposure data, wherein, in the backscattering intensity generation step, with respect to the $n^{th}$ layer from the resist layer among the plurality of layers, there is provided, for each of the substances contained in the $n^{th}$ layer, a reflection coefficient (rn), which corresponds with the number of particles reflected by the $n^{th}$ layer among the charged particles transmitted by the $(n-1)^{th}$ layer; a transmission coefficient (tn), which corresponds with the number of particles transmitted by the $n^{th}$ layer among the charged particles reaching the $n^{th}$ layer; and a scatter distribution in which the charged particles are scattered within the $n^{th}$ layer; and the backscattering intensity generation step comprises a first step of determining the backscattering intensity by using the reflection coefficient (rn), the transmission coefficient (tn), and the scatter distribution.

13. The semiconductor device fabrication method according to claim 12, wherein, in the first step, with respect to a predetermined focus area of the $n^{th}$ layer, surface integration is performed on the charged particle scattering intensity from the surrounding area that includes the focus area, in accordance with a surface area density ($\alpha$n) of the substance(s) in the $n^{th}$ layer, and a distance coefficient (an)

determined from the scatter distribution and corresponding with the distance between the surrounding area and the focus area.

14. The semiconductor device fabrication method according to claim 13, wherein the charged particle scattering intensity of the first step includes (1) a downwardly transmitted charged particle intensity determined by multiplying the transmission coefficient (tn) by a first charged particle intensity transmitted by the $(n-1)^{th}$ layer, and (2) a third charged particle intensity, which is determined by adding a reflected charged particle intensity determined by multiplying the reflection coefficient (rn) by the first charged particle intensity and an upwardly transmitted charged particle intensity determined by multiplying the transmission coefficient (tn) by a second charged particle intensity returning from the $(n+1)^{th}$ layer.

15. The semiconductor device fabrication method according to claim 14, wherein the first step with respect to the $n^{th}$ layer is performed recursively from the first layer to the lowest layer of the plurality of layers.

16. The semiconductor device fabrication method according to claim 15, wherein the third charged particle intensity determined in the first layer below the resist layer is treated as the backscattering intensity.

17. The semiconductor device fabrication method according to claim 14, wherein, when the first step is executed with respect to the first layer of the plurality of layers, the first charged particle intensity is determined from the charged particle intensity irradiated onto the resist layer in accordance with the exposure pattern density.

18. The semiconductor device fabrication method according to claim 14, wherein, when, in the surface integration of the first step, the $n^{th}$ layer is divided into a plurality of fragmented areas, the first charged particle intensity, the downwardly transmitted charged particle intensity, the reflected charged particle intensity, the upwardly transmitted charged particle intensity, and the third charged particle intensity are determined in each area.

19. The semiconductor device fabrication method according to claim 18, wherein the area size of a lower layer further from the resist layer is larger than the area size of an upper layer close to the resist layer.

20. The semiconductor device fabrication method according to claim 12, wherein the lowest layer of the plurality of layers is a semiconductor substrate.

21. The semiconductor device fabrication method according to claim 12, wherein the substances contained in each of the layers include at least one of a conductive material, an insulation material, and a semiconductor material, or all these materials.

22. A method for generating a backscattering intensity with which charged particles are backscattered to a resist layer formed over a plurality of layers, each of which includes a pattern of one substance or a plurality of substances, in a case where a charged particle beam is irradiated onto the resist layer, wherein the backscattering intensity of the nth resist layer is generated by moving from the substrate in the direction of the upper layers, comprising the step of:

determining the backscattering intensity from a charged particle intensity coefficient map $(M_{n-1})$, which is produced by determining, in correspondence with all first and second areas, a charged particle intensity coefficient that includes a proportion of charged particles entering the first area that return to the second area after being reflected by layers below and including (n−1)th layer below the nth layer, and from design data $(IN_n)$ that includes pattern data of the nth layer, wherein the first and second areas are constituted by a plurality of divided microregions.

23. The charged particle backscattering intensity generation method according to claim 22, wherein:

a transmission coefficient $(T_n)$ corresponding to a ratio at which the charged particles entering the nth layer are transmitted by the nth layer, a reflection coefficient $(R_n)$ corresponding to a ratio of reflection of the nth layer, and a scatter distribution coefficient $(A_n)$ within the nth layer are provided for each substance of the nth layer.

the backscattering intensity generation method further comprises the step of:

determining the charged particle intensity coefficient map $(M_n)$ of the layers below and including the nth layer, wherein the step of determining the charged particle intensity coefficient map $(M_n)$ comprises the steps of:

determining a first reflected charged particle intensity coefficient (E1) that represents a proportion of charged particles reflected within the nth layer by using the pattern area density $(\alpha_n)$, the reflection coefficient, and the scatter distribution coefficient of each substance contained in the nth layer determined from the design data $(IN_n)$ of the nth layer;

determining a second reflected charged particle intensity coefficient (E4) that represents a proportion of charged particles reflected by the layers below and including the (n−1)th layer by using the pattern area density, the transmission coefficient, the scatter distribution coefficient, and the charged particle intensity coefficient map $(M_n-1)$ for the layers below and including the (n−1)th layer; and determining the sum (E1+E4) of the first and second reflected charged particle intensity coefficients.

24. The charged particle backscattering intensity generation method according to claim 23, wherein:

the step of determining the charged particle intensity coefficient map determines the sum (E1+E4) of the reflected charged particle intensity coefficients with respect to a second area group corresponding to all the first areas.

25. The charged particle backscattering intensity generation method according to claim 22, wherein the step of determining the backscattering intensity comprises:

a step of determining the backscattering intensity by multiplying the pattern area density $(\alpha)$ determined from the design data of the nth layer and a charged particle intensity coefficient $(E_{n-1})$ contained in the charged particle intensity coefficient map $(M_n\_1)$ for the (n−1)th layer by an exposure amount (Q) that enters the nth layer.

26. A charged particle backscattering intensity generation program that causes a computer to execute a procedure to generate the backscattering intensity with which charged particles are backscattered to a resist layer that is formed over a plurality of layers, each of which includes a pattern of one substance or a plurality of substances, in a case where a charged particle beam is irradiated onto the resist layer, wherein the backscattering intensity of the nth resist layer is generated by moving from the substrate in the direction of the upper layers, wherein:

the generation procedure comprises:

determining, the backscattering intensity from a charged particle intensity coefficient map $(M_{n-1})$, which is produced by determining, in correspondence with all first and second areas, a charged particle intensity coefficient that includes a proportion of charged particles entering the first area that return to the second area after being reflected by the layers below and including the (n−1)th layer below the nth layer, and from design data ($IN_n$) that includes pattern data of the nth layer, wherein the first and second areas are constituted by a plurality of divided microregions.

27. A method for fabricating a semiconductor device having a plurality of layers, each of which includes a pattern of one substance or a plurality of substances, comprising the steps of:

generating, in a case where a charged particle beam is irradiated onto a resist layer formed over at least one of the plurality of layers, backscattering intensity with which charged particles are backscattered to the resist layer;

generating corrected exposure data by subjecting exposure data having an exposure pattern to a proximity effect correction in accordance with the backscattering intensity; and performing exposure, development and patterning by means of the corrected exposure data, wherein the backscattering intensity generation step comprises a step of:

determining the backscattering intensity from a charged particle intensity coefficient map ($M_{n-1}$), which is produced by determining, in correspondence with all first and second areas, a charged particle intensity coefficient that includes a proportion of charged particles entering the first area that return to the second area after being reflected by the layers below and including (n−1)th layer below the nth layer, and from design data ($IN_n$) that includes pattern data of the nth layer, wherein the first and second areas are constituted by a plurality of divided microregions.

28. The semiconductor device fabrication method according to claim 27, wherein:

a transmission coefficient ($T_n$) corresponding to a ratio at which the charged particles entering the nth layer are transmitted by the nth layer, a reflection coefficient ($R_n$) corresponding to a ratio of reflection of the nth layer, and a scatter distribution coefficient ($A_n$) within the nth layer are provided for each substance of the nth layer;

the backscattering intensity generation step further comprises the step of:

determining the charged particle intensity coefficient map ($M_n$) of the layers below and including the nth layer, wherein the step of determining the charged particle intensity coefficient map ($M_n$) comprises the steps of:

determining a first reflected charged particle intensity coefficient (E1) that represents a proportion of charged particles reflected within the nth layer by using the pattern area density ($\alpha_n$), the reflection coefficient, and the scatter distribution coefficient of each substance contained in the nth layer determined from the design data ($IN_n$) of the nth layer;

determining a second reflected charged particle intensity coefficient (E4) that represents a proportion of charged particles reflected by the layers below and including the (n−1)th layer by using the pattern area density, the transmission coefficient, the scatter distribution coefficient, and the charged particle intensity coefficient map ($M_n-1$) for the layers below and including the (n−1)th layer; and determining the sum (E1+E4) of the first and second reflected charged particle intensity coefficients.

29. The semiconductor device fabrication method according to claim 27, wherein:

the step of generating the corrected exposure data and the step of determining the charged particle intensity coefficient map are performed for each layer by moving from the substrate side in the direction of the upper layers.

* * * * *

UNITED STATES PATENT AND TRADEMARK OFFICE
CERTIFICATE OF CORRECTION

PATENT NO. : 7,205,078 B2
APPLICATION NO. : 10/853760
DATED : April 17, 2007
INVENTOR(S) : Morimi Osawa et al.

It is certified that error appears in the above-identified patent and that said Letters Patent is hereby corrected as shown below:

Column 26, Line 66, change "contained," to --contained--.

Column 28, Line 21, change "layer" to --layer;--.

Column 30, Line 11, change "layer." to --layer;--.

Column 30, Line 49, change "$(M_n-1)$" to --$(M_{n-1})$--.

Column 32, Line 24, change "$(M_n-1)$" to --$(M_{n-1})$--.

Signed and Sealed this

Twenty-first Day of August, 2007

JON W. DUDAS
*Director of the United States Patent and Trademark Office*